US012671371B2

(12) United States Patent
Naseri Ali Abadi et al.

(10) Patent No.: US 12,671,371 B2
(45) Date of Patent: Jun. 30, 2026

(54) DIFFERENTIAL RADIO FREQUENCY AMPLIFIER

(71) Applicant: Skyworks Solutions, Inc., Irvine, CA (US)

(72) Inventors: Mehdi Naseri Ali Abadi, Stittsville (CA); Hassan Sarbishaei, Ottawa (CA); Mostafa Azizi, Stittsville (CA)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 673 days.

(21) Appl. No.: 17/964,774

(22) Filed: Oct. 12, 2022

(65) Prior Publication Data

US 2023/0112435 A1 Apr. 13, 2023

Related U.S. Application Data

(60) Provisional application No. 63/255,132, filed on Oct. 13, 2021, provisional application No. 63/276,447, filed on Nov. 5, 2021.

(51) Int. Cl.
*H03F 1/22* (2006.01)
*H03F 1/56* (2006.01)
*H03F 3/195* (2006.01)
*H03F 3/24* (2006.01)
*H03F 3/45* (2006.01)

(52) U.S. Cl.
CPC ............. *H03F 3/195* (2013.01); *H03F 1/223* (2013.01); *H03F 1/565* (2013.01); *H03F 3/245* (2013.01); *H03F 3/45179* (2013.01); *H03F 2200/451* (2013.01)

(58) Field of Classification Search
CPC .......................................................... H03F 1/22
USPC .................................................. 330/311, 252
See application file for complete search history.

(56) References Cited

U.S. PATENT DOCUMENTS

| 4,641,108 A | * | 2/1987 | Gill, Jr. | ................ H10D 84/901 |
| | | | | 330/252 |
| 5,317,173 A | | 5/1994 | Sovero | |
| 5,389,840 A | | 2/1995 | Dow | |
| 6,072,882 A | | 6/2000 | White et al. | |

(Continued)

OTHER PUBLICATIONS

Al-Shaharani, "Differential CMOS Class-E RF Power Amplifier" Proceedings of the 2007 WSEAS Int. Conference on Circuits Systems, Signal and Telecommunications, Gold Coast, Australia, Jan 179-19, 2007 in 4 pages.

(Continued)

*Primary Examiner* — Henry Choe
(74) *Attorney, Agent, or Firm* — Knobbe, Martens, Olson & Bear, LLP

(57) ABSTRACT

A fully differential power amplifier has an input matching network, a plurality of stacked transistors connected by a plurality of inter stack networks (ISNs), and an output matching network for amplification and conditioning of signal components. The differential amplifier uses a modified cascode FET topology with the FETs connected by gate decoupling capacitors to strongly attenuate common mode oscillations and eliminate the need for a source degeneration inductor or matching transformer. Inter stack networks provide signal conditioning and filtering between amplification stages to improve amplifier performance metrics such as long-term reliability, output power, and efficiency.

20 Claims, 15 Drawing Sheets

(56) References Cited

U.S. PATENT DOCUMENTS

| | | | |
|---|---|---|---|
| 6,137,367 A * | 10/2000 | Ezzedine | H03F 3/193 |
| | | | 330/311 |
| 6,151,509 A | 11/2000 | Chorey | |
| 6,188,203 B1 | 2/2001 | Rice et al. | |
| 6,404,284 B1 | 6/2002 | Johnson | |
| 6,424,441 B1 | 7/2002 | White et al. | |
| 6,445,251 B1 | 9/2002 | Robinson | |
| 6,466,770 B1 | 10/2002 | Griffith et al. | |
| 6,559,722 B1 | 5/2003 | Lopez et al. | |
| 6,639,534 B2 | 10/2003 | Khoini-Poorfard et al. | |
| 6,704,560 B1 | 3/2004 | Balteanu et al. | |
| 6,734,729 B1 | 5/2004 | Andrys et al. | |
| 6,842,067 B2 | 1/2005 | Andrys et al. | |
| 6,909,390 B2 | 6/2005 | Khoini-poorfard et al. | |
| 6,937,102 B2 | 8/2005 | Lopez et al. | |
| 7,057,544 B2 | 6/2006 | Lilamwala | |
| 7,095,801 B1 | 8/2006 | Magoon et al. | |
| 7,145,359 B2 | 12/2006 | Hein et al. | |
| 7,170,337 B2 | 1/2007 | Whittaker | |
| 7,276,973 B2 | 10/2007 | Ripley et al. | |
| 7,301,396 B1 | 11/2007 | Johnson et al. | |
| 7,312,662 B1 * | 12/2007 | Roo | H03F 3/265 |
| | | | 330/253 |
| 7,376,212 B2 | 5/2008 | Dupuis | |
| 7,414,479 B2 | 8/2008 | Ripley et al. | |
| 7,446,613 B2 * | 11/2008 | Westwick | H03F 3/21 |
| | | | 330/135 |
| 7,459,974 B2 | 12/2008 | Johnson et al. | |
| 7,493,097 B2 | 2/2009 | Ismail et al. | |
| 7,516,340 B2 | 4/2009 | Landry et al. | |
| 7,548,799 B2 | 6/2009 | Landry et al. | |
| 7,696,826 B2 | 4/2010 | Ripley et al. | |
| 8,072,245 B2 | 12/2011 | Akyol et al. | |
| 8,115,663 B2 | 2/2012 | Marques | |
| 8,203,370 B2 | 6/2012 | Yan et al. | |
| 8,810,314 B2 | 8/2014 | Mulawski et al. | |
| 8,816,769 B2 * | 8/2014 | Moreira | H03F 3/45188 |
| | | | 330/253 |
| 8,830,000 B2 * | 9/2014 | Jeong | H03F 3/211 |
| | | | 330/311 |
| 9,020,165 B2 | 4/2015 | Viegas | |
| 9,041,472 B2 | 5/2015 | Chen et al. | |
| 9,124,230 B2 | 9/2015 | Akyol et al. | |
| 9,264,080 B2 | 2/2016 | May | |
| 9,588,529 B2 | 3/2017 | Balteanu et al. | |
| 9,800,216 B2 | 10/2017 | Pukhovski | |
| 9,813,029 B2 | 11/2017 | Zhu et al. | |
| 9,831,834 B2 | 11/2017 | Balteanu et al. | |
| 9,866,196 B2 | 1/2018 | Gorbachov | |
| 9,991,856 B2 | 6/2018 | Khesbak et al. | |
| 10,097,216 B2 | 10/2018 | Gorbachov et al. | |
| 10,218,310 B2 | 2/2019 | Arfaei Malekzadeh et al. | |
| 10,277,177 B2 | 4/2019 | Khesbak et al. | |
| 10,312,871 B2 | 6/2019 | Pukhovski | |
| 10,365,308 B2 | 7/2019 | Zhang et al. | |
| 10,396,833 B2 | 8/2019 | Gorbachov et al. | |
| 10,438,735 B2 | 10/2019 | Zhang et al. | |
| 10,454,429 B2 | 10/2019 | Balteanu et al. | |
| 10,483,918 B2 | 11/2019 | Jin et al. | |
| 10,566,946 B2 | 2/2020 | Gorbachov | |
| 10,601,320 B2 | 3/2020 | Balteanu et al. | |
| 10,615,757 B2 | 4/2020 | Balteanu et al. | |
| 10,658,977 B2 | 5/2020 | Arfaei Malekzadeh et al. | |
| 11,018,714 B2 | 5/2021 | Arfaei Malekzadeh et al. | |
| 11,329,609 B2 | 5/2022 | Johnson et al. | |
| 11,361,896 B2 | 6/2022 | Zhang et al. | |
| 11,374,610 B2 | 6/2022 | Arfaei Malekzadeh et al. | |
| 11,489,501 B2 | 11/2022 | Rabjohn | |
| 11,595,008 B2 | 2/2023 | Jain et al. | |
| 2002/0021174 A1 | 2/2002 | Robinson | |
| 2003/0020540 A1 | 1/2003 | Johnson | |
| 2003/0151533 A1 | 8/2003 | Khoini-Poorfard et al. | |

| | | | |
|---|---|---|---|
| 2004/0119621 A1 | 6/2004 | Khoini-poorfard et al. | |
| 2005/0206412 A1 | 9/2005 | Moraveji | |
| 2005/0231273 A1 | 10/2005 | Whittaker | |
| 2005/0258994 A1 | 11/2005 | Lilamwala | |
| 2005/0271148 A1 | 12/2005 | Dupuis | |
| 2006/0049874 A1 | 3/2006 | Pan | |
| 2007/0001766 A1 | 1/2007 | Ripley et al. | |
| 2007/0075784 A1 * | 4/2007 | Pettersson | H03F 1/223 |
| | | | 330/311 |
| 2008/0005598 A1 | 1/2008 | Landry et al. | |
| 2008/0007341 A1 | 1/2008 | Ripley et al. | |
| 2008/0024106 A1 | 1/2008 | Landry et al. | |
| 2008/0186096 A1 | 8/2008 | Johnson et al. | |
| 2009/0115520 A1 | 5/2009 | Ripley et al. | |
| 2010/0148871 A1 | 6/2010 | Lee et al. | |
| 2010/0194443 A1 | 8/2010 | Akyol et al. | |
| 2010/0237941 A1 | 9/2010 | Goldfarb et al. | |
| 2010/0327930 A1 | 12/2010 | Yan et al. | |
| 2011/0037518 A1 | 2/2011 | Lee et al. | |
| 2011/0254720 A1 | 10/2011 | Marques | |
| 2011/0261734 A1 | 10/2011 | Dupuy et al. | |
| 2012/0038418 A1 | 2/2012 | Akyol et al. | |
| 2012/0077551 A1 | 3/2012 | Balteanu et al. | |
| 2013/0063210 A1 | 3/2013 | Corsi et al. | |
| 2013/0127010 A1 | 5/2013 | Genik et al. | |
| 2013/0344838 A1 | 12/2013 | Li et al. | |
| 2014/0098974 A1 | 4/2014 | Viegas | |
| 2014/0253234 A1 | 9/2014 | Lee et al. | |
| 2015/0130539 A1 | 5/2015 | Gorbachov | |
| 2015/0222305 A1 | 8/2015 | May | |
| 2015/0280653 A1 | 10/2015 | Wimpenny | |
| 2016/0027571 A1 | 1/2016 | Zhang et al. | |
| 2016/0036389 A1 | 2/2016 | Balteanu et al. | |
| 2016/0094192 A1 | 3/2016 | Khesbak et al. | |
| 2016/0112008 A1 | 4/2016 | Pukhovski | |
| 2016/0190996 A1 | 6/2016 | Searle | |
| 2016/0261235 A1 | 9/2016 | Ortiz | |
| 2016/0261238 A1 | 9/2016 | Ortiz | |
| 2016/0261242 A1 | 9/2016 | Ortiz | |
| 2017/0005623 A1 | 1/2017 | Zhu et al. | |
| 2017/0160318 A1 | 6/2017 | Zhang et al. | |
| 2017/0163294 A1 | 6/2017 | Gorbachov et al. | |
| 2018/0076770 A1 | 3/2018 | Arfaei Malekzadeh et al. | |
| 2018/0091114 A1 | 3/2018 | Gorbachov | |
| 2018/0159487 A1 | 6/2018 | Pukhovski | |
| 2018/0278214 A1 | 9/2018 | Jin et al. | |
| 2018/0287573 A1 | 10/2018 | Khesbak et al. | |
| 2018/0309286 A1 | 10/2018 | Kaundinya et al. | |
| 2018/0375483 A1 | 12/2018 | Balteanu et al. | |
| 2019/0044554 A1 | 2/2019 | Gorbachov et al. | |
| 2019/0123690 A1 | 4/2019 | Balteanu et al. | |
| 2019/0149094 A1 | 5/2019 | Arfaei Malekzadeh et al. | |
| 2019/0229621 A1 | 7/2019 | Balteanu et al. | |
| 2019/0331716 A1 | 10/2019 | Zhang et al. | |
| 2019/0356286 A1 | 11/2019 | Pukhovski | |
| 2019/0385781 A1 | 12/2019 | Zhang et al. | |
| 2020/0169285 A1 | 5/2020 | Arfaei Malekzadeh et al. | |
| 2021/0091724 A1 | 3/2021 | Johnson et al. | |
| 2021/0119593 A1 | 4/2021 | Rabjohn | |
| 2021/0143795 A1 | 5/2021 | Azizi | |
| 2021/0218373 A1 | 7/2021 | Jain et al. | |
| 2021/0242897 A1 | 8/2021 | Arfaei Malekzadeh et al. | |
| 2022/0187862 A1 | 6/2022 | Onódy et al. | |
| 2023/0095653 A1 | 3/2023 | Jain et al. | |
| 2023/0107607 A1 | 4/2023 | Nisbet et al. | |
| 2023/0112435 A1 | 4/2023 | Naseri et al. | |

OTHER PUBLICATIONS

Wang et al. "Design of Bifet Stacked Folded Differential Power Amplifier for TD-LTE" International Core Journal of Engineering, vol. 1, No. 5, ISSN: 2414-1895 in 6 pages.

* cited by examiner

MXN DL MIMO

NXM UL MIMO

460

OMN
465

— 470

— 475

440a

445

440b

450a

450b

Vbias(n)
455

ISN (n)
435

420a

420b

415

416a

417

416b

418a

418b

415a

415b

411
+

412
—

DIFFERENTIAL RADIO FREQUENCY AMPLIFIER

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57.

BACKGROUND

Field of the Invention

Embodiments of the invention relate to electronic systems, and in particular, to radio frequency (RF) electronics.

Description of the Related Art

Power amplifiers can be used to boost or amplify a radio frequency (RF) signal. Thereafter, the boosted RF signal can be used for a variety of purposes, including, for example, driving an antenna of an RF communication system.

Power amplifiers can be included in a wide variety of communication devices, including, but not limited to, mobile phones, tablets, base stations, network access points, laptops, computers, and televisions. Power amplifiers provide amplification to RF signals, which can have a frequency in the range from about 450 MHz to about 90 GHz for certain communication standards.

SUMMARY

In certain embodiments, the present disclosure relates to a semiconductor die for a radio frequency communication system. The semiconductor die includes a power amplifier having a first half circuit and a second half circuit that operate differentially to provide amplification of radio frequency signals. The first and second half circuits form a transistor stack that provides amplification by way of field effect transistors connected with a gate decoupling capacitor.

In various embodiments, the semiconductor die further includes a plurality of bias resistors connecting a gate terminal of each transistor to a voltage source, and a plurality of inter stack networks, each inter stack network connecting a drain terminal of one stack transistor to a source terminal of another stack transistor.

In a number of embodiments, the differential power amplifier further includes an input stack section having a first half and a second half field effect transistor, the input stack transistors each having a gate, a source, and a drain terminal, wherein the input stack gate terminals are connected to a pair of differential signal inputs. In accordance with several embodiments, the differential power amplifier further includes an output stack section having a first half and a second half field effect transistor, the output stack transistors each having a gate, a source, and a drain terminal, wherein the output stack drain terminals are connected to a pair of differential signal outputs.

In some embodiments, the differential power amplifier further includes at least one of an input balun configured to provide single-ended to differential signal conversion or an output balun configured to provide differential to single-ended signal conversion.

In some embodiments, the differential power amplifier further includes an input matching network connected to the differential signal inputs. In certain embodiments, the differential power amplifier further includes an output matching network connected to the differential signal outputs.

In some embodiments the differential power amplifier further includes a source degeneration network connected to the source terminals of the input stack section.

In some aspects, the techniques described herein relate to a power amplifier having a first half circuit and a second half circuit that operate differentially to provide amplification of radio frequency signals, the power amplifier including: at least a first and second stack section each including a first-half field effect transistor and a second-half field effect transistor, a gate decoupling capacitor differentially connecting gate terminals of the first-half field effect transistor and the second-half field effect transistor together to attenuate signals in common mode operation, and a first-half bias resistor and a second-half bias resistor, the bias resistors connecting the gate terminals of the first-half field effect transistor and the second-half field effect transistor to a voltage source; and an inter stack network connecting an output of the first stack section to an input of the second stack section.

In some aspects, the techniques described herein relate to a power amplifier wherein the differential power amplifier further includes an input stack section having a first-half field effect transistor and a second-half field effect transistor having gate terminals connected to a pair of differential signal inputs.

In some aspects, the techniques described herein relate to a power amplifier wherein the differential power amplifier further includes an input matching network connected to the differential signal inputs.

In some aspects, the techniques described herein relate to a power amplifier wherein the differential power amplifier further includes a source degeneration network connected to the source terminals of the input stack section.

In some aspects, the techniques described herein relate to a power amplifier wherein the differential power amplifier further includes an output stack section having a first-half field effect transistor and a second-half field effect transistor having drain terminals connected to a pair of differential signal outputs.

In some aspects, the techniques described herein relate to a power amplifier wherein the differential power amplifier further includes an output matching network connected to the differential signal outputs.

In some aspects, the techniques described herein relate to a power amplifier wherein the differential power amplifier further includes at least one of an input balun configured to provide single-ended to differential signal conversion or an output balun configured to provide differential to single-ended signal conversion.

In some aspects, the techniques described herein relate to a semiconductor die for a radio frequency communication system, the semiconductor die including: a substrate; and a differential power amplifier supported by the substrate and including a first half circuit and a second half circuit that operate differentially to provide amplification, the power amplifier including a plurality of intermediate stack sections each including first-half and second-half field effect transistors, first-half and second-half bias resistors, and a gate decoupling capacitor, the gate decoupling capacitor connecting gate terminals of the first-half and second-half field effect transistors together to attenuate signals in common mode operation, the first-half bias resistor connected between the gate terminal of the first-half field effect transistor and a voltage source, the second-half bias resistor connected between the gate terminal of the second-half field effect transistor and the voltage source, the power amplifier further including a plurality of inter stack networks connected between at least some of the stack sections to provide impedance matching.

In some aspects, the techniques described herein relate to a semiconductor die wherein the differential power amplifier further includes an input stack section having a first-half and a second-half field effect transistor having gate terminals connected to a pair of differential signal inputs.

In some aspects, the techniques described herein relate to a semiconductor die wherein the differential power amplifier further includes an input matching network connected to the differential signal inputs.

In some aspects, the techniques described herein relate to a semiconductor die wherein the differential power amplifier further includes a source degeneration network connected to the source terminals of the input stack section transistors.

In some aspects, the techniques described herein relate to a semiconductor die wherein the differential power amplifier further includes an output stack section having a first-half and a second-half field effect transistor having drain terminals connected to a pair of differential signal outputs.

In some aspects, the techniques described herein relate to a semiconductor die wherein the differential power amplifier further includes an output matching network connected to the differential signal outputs.

In some aspects, the techniques described herein relate to a semiconductor die wherein each inter stack network includes an inductor or a capacitor network.

In some aspects, the techniques described herein relate to a semiconductor die wherein the inductor or capacitor network includes a first-half and second-half inductor each connected serially between an input terminal and an output terminal of the inter stack network.

In some aspects, the techniques described herein relate to a semiconductor die wherein the inductor or capacitor network electrically connects a first input to a second input of the inter stack network, and electrically connects a first output and a second output of the inter stack network.

In some aspects, the techniques described herein relate to a semiconductor die wherein the differential power amplifier further includes at least one of an input balun configured to provide single-ended to differential signal conversion or an output balun configured to provide differential to single-ended signal conversion.

In some aspects, the techniques described herein relate to a semiconductor die wherein the gate decoupling capacitor of each stack section is implemented with an equivalent circuit.

In some aspects, the techniques described herein relate to a semiconductor die wherein the gate decoupling capacitor is implemented with at least one of a series capacitor network configured to provide an equivalent capacitance or a parallel capacitor network configured to provide an equivalent capacitance.

In some aspects, the techniques described herein relate to a semiconductor die wherein the gate decoupling capacitor of each stack section attenuates common mode signals to less than 0 dB.

In some aspects, the techniques described herein relate to a semiconductor die further including a voltage ladder utilizing a resistor divider to generate a plurality of voltage sources for biasing the intermediate stack sections.

In some aspects, the techniques described herein relate to a semiconductor die further including a digital signal processing circuit configured to control a first radio frequency input signal to a first differential power amplifier and a second radio frequency input signal to a second differential power amplifier, the digital signal processing circuit operable to provide at least one of multi-input multi-output encoding or beam forming.

In some aspects, the techniques described herein relate to a semiconductor die wherein the differential power amplifier includes a plurality of amplification stages to provide cascading signal amplification, the plurality of amplification stages including an output stack section of one amplification stage which is operably connected to an input stack section of an adjacent amplification stage.

In some aspects, the techniques described herein relate to a mobile device including: an antenna; and a radio frequency module operatively coupled to the antenna, the module including a differential power amplifier including a first half circuit and a second half circuit that operate differentially to provide amplification, the power amplifier including a plurality of intermediate stack sections each including first-half and second-half field effect transistors, first-half and second-half bias resistors, a gate decoupling capacitor, the gate decoupling capacitor connecting gate terminals of the first-half and second-half field effect transistors together to attenuate signals in common mode operation, the first-half bias resistor connected between the gate terminal of the first-half field effect transistor and a voltage source, the second-half bias resistor connected between the gate terminal of the second-half field effect transistor and the voltage source, the power amplifier further including a plurality of inter stack networks connected between at least some of the stack sections to provide impedance matching.

DETAILED DESCRIPTION OF THE PREFERRED EMBODIMENT

Figure 1:
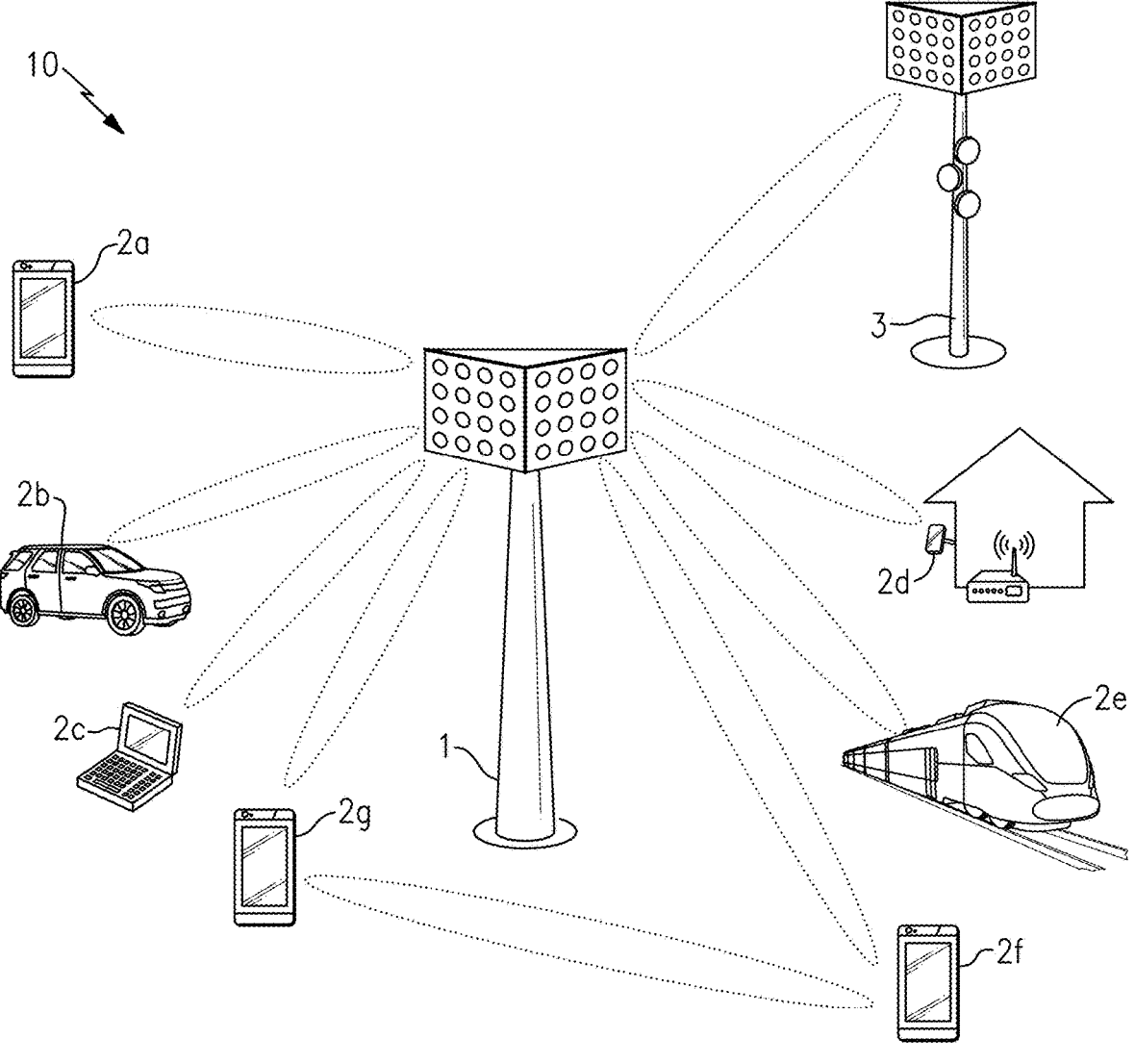
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP plans to introduce Phase 1 of fifth generation (5G) technology in Release 15 (targeted for 2018) and Phase 2 of 5G technology in Release 16 (targeted for 2019). Release 15 is anticipated to address 5G communications at less than 6 GHz, while Release 16 is anticipated to address communications at 6 GHz and higher. Subsequent 3GPP releases will further evolve and expand 5G technology. 5G technology is also referred to herein as 5G New Radio (NR).

Preliminary specifications for 5G NR support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, and a second mobile device 2f.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices.

The illustrated communication network 10 of FIG. 1 supports communications using a variety of technologies, including, for example, 4G LTE, 5G NR, and wireless local area network (WLAN), such as Wi-Fi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. In one embodiment, one or more of the mobile devices support a HPUE power class specification.

In certain implementations, a base station and/or user equipment communicates using beam forming. For example, beam forming can be used to focus signal strength to overcome path losses, such as high loss associated with communicating over high signal frequencies. In certain embodiments, user equipment, such as one or more mobile phones, communicate using beam forming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDM is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beam forming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
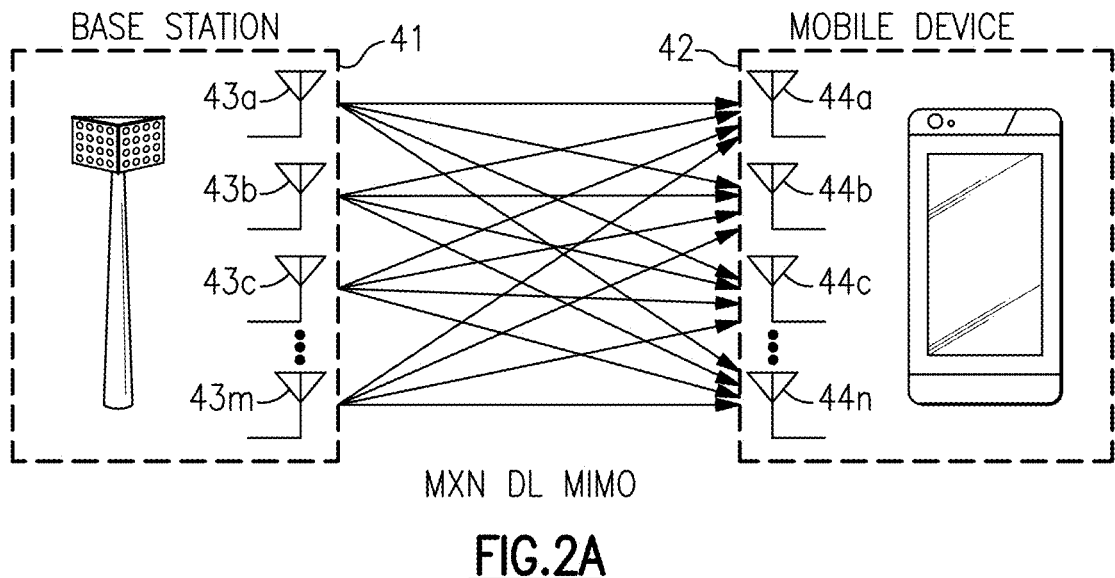
FIG. 2A is a schematic diagram of one example of a downlink channel using multi-input and multi-output (MIMO) communications.
Figure 2B:
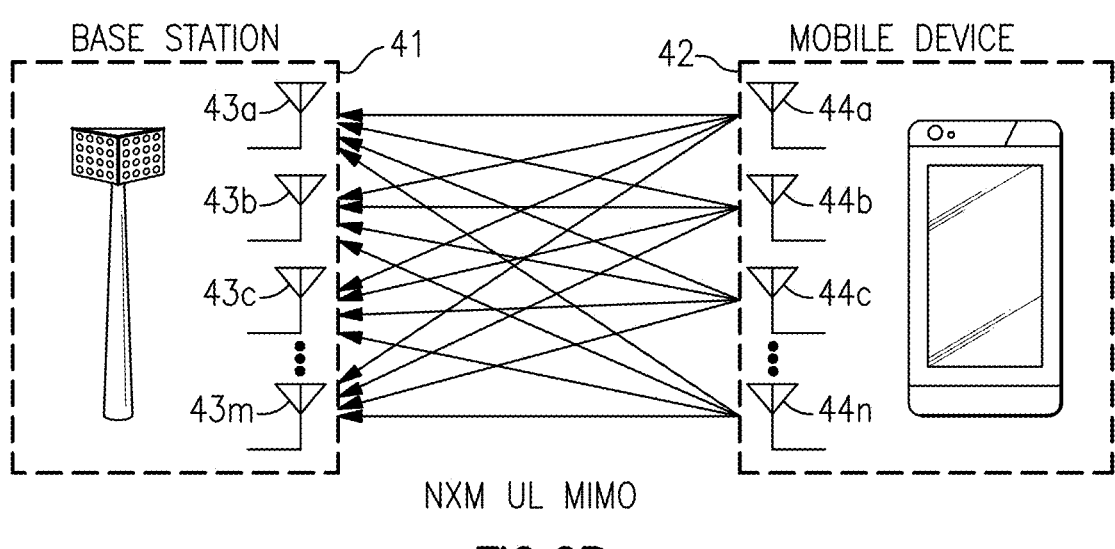
FIG. 2B is schematic diagram of one example of an uplink channel using MIMO communications.

FIG. 2A is a schematic diagram of one example of a downlink channel using multi-input and multi-output (MIMO) communications. FIG. 2B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 2A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 2A illustrates an example of M×N DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 2B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 2B illustrates an example of N×M UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3A:
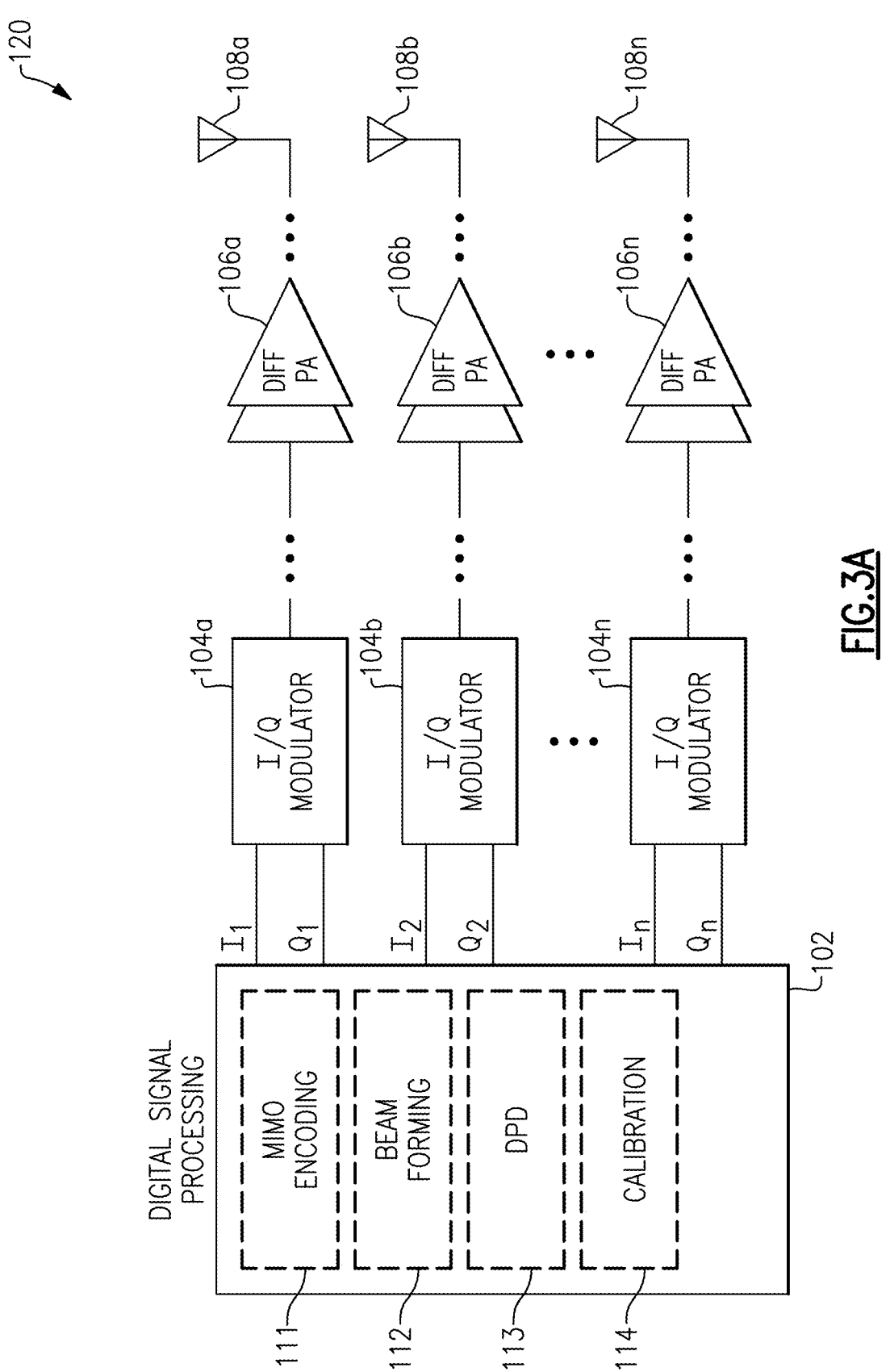
FIG. 3A is a schematic diagram of one embodiment of a communication system for transmitting radio frequency (RF) signals.
Figure 3B:
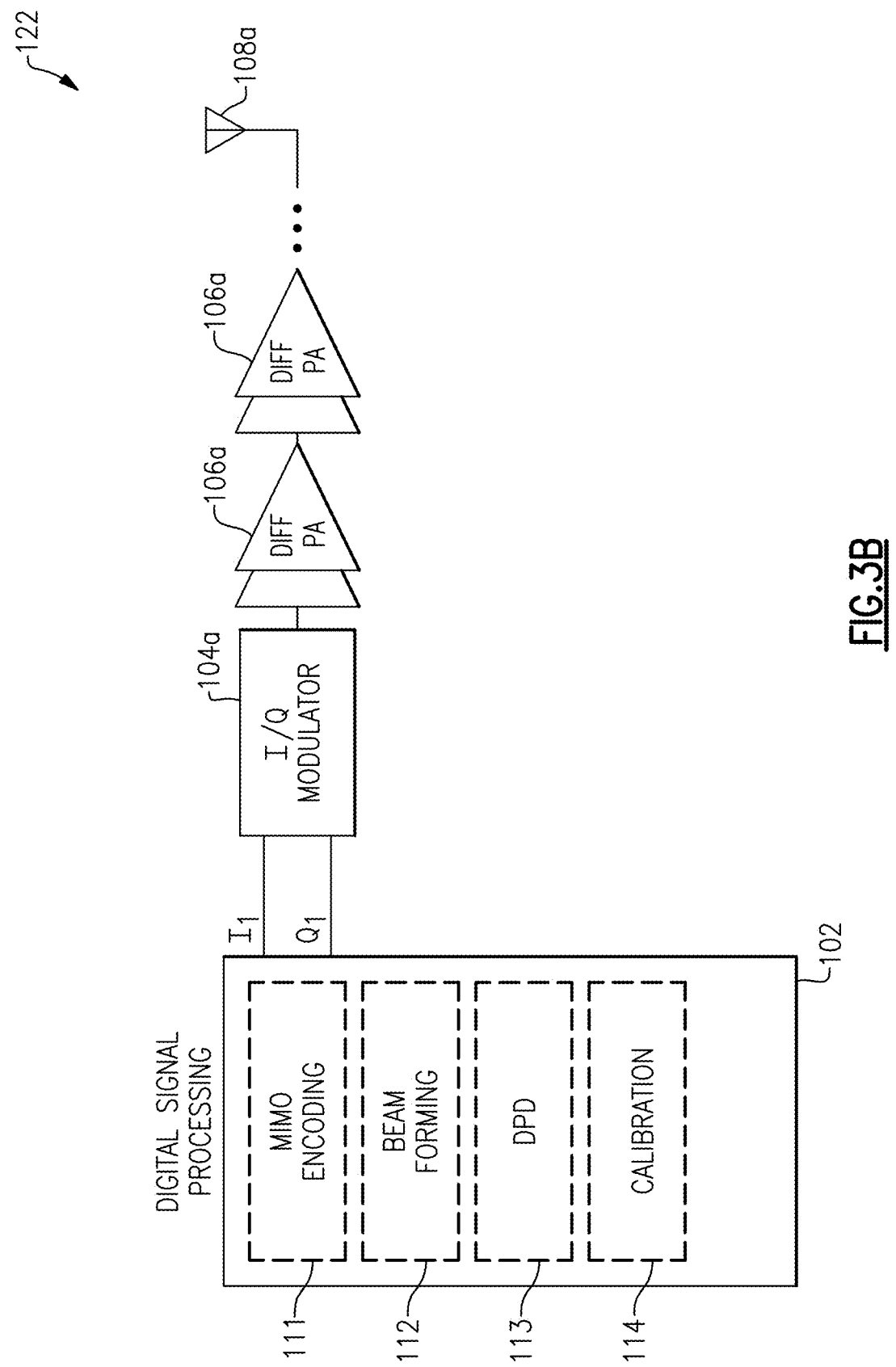
FIG. 3B is a schematic diagram of one embodiment of a communication system for transmitting radio frequency (RF) signals.

FIGS. 3A and 3B are schematic diagrams of various embodiments of a communication system 120 for transmitting RF signals. The communication system 120 includes a digital signal processing circuit 102, I/Q modulators 104*a*, 104*b* . . . 104*n*, differential power amplifiers 106*a*, 106*b* . . . 106*n*, and antennas 108*a*, 108*b* . . . 108*n*.

In the embodiment illustrated in FIG. 3A, the communication system 120 includes three transmit signal paths, each of which includes an I/Q modulator, a differential power amplifier, and an antenna. Although three transmit signal paths are shown, the communication system 120 can include more or fewer transmit signal paths as indicated by the ellipses.

In the embodiment illustrated in FIG. 3B, the communication system 120 includes a transmit path with cascaded amplifier stages, which includes an I/Q modulator, two differential power amplifiers, and an antenna. Although one transmit signal path is shown, the communication system 120 can include more transmit signal paths as illustrated in FIG. 3A. Each transmit signal path can include more or fewer cascaded amplifier stages as indicated by the ellipses.

Thus, the communication system 120 can be implemented with any suitable number of I/Q modulators, differential power amplifiers, and/or antennas. Furthermore, although certain components of the transmit signal path are shown, additional components can be included in one or more of the transmit signal paths. Examples of circuits and components that can be included in a transmit signal path include, but are not limited to, filters, resonators, attenuators, amplifiers, phase shifters, duplexers, diplexers, triplexers, detectors, directional couplers, and/or switches.

As shown in FIGS. 3A and 3B, the digital signal processing circuit 102 provides a pair of I and Q signals to each of the I/Q modulators 104*a*, 104*b* . . . 104*n*. Each pair of I and Q signals can be used to represent a sinusoidal wave or signal of desired amplitude, frequency, and phase. For example, the I signal can be used to represent an in phase component of the sinusoidal wave and the Q signal can be used to represent a quadrature component of the sinusoidal wave, which can be an equivalent representation of the sinusoidal wave. In certain implementations, the I and Q signals are provided to the I/Q modulators in a digital format.

Each of the I/Q modulators 104*a*, 104*b* . . . 104*n* receives a pair of I and Q signals from the digital signal processing circuit 102 and processes the I and Q signals to generate an RF signal. For example, each I/Q modulator can include digital-to-analog converters (DACs) configured to convert the I and Q signals into an analog format, mixers for upconverting the I and Q signals to radio frequency, and a signal combiner for combining the upconverted I and Q signals into an RF signal suitable for amplification by a differential power amplifier. In certain implementations, the I/Q modulator can include one or more filters configured to filter frequency content of signals processed therein.

As shown in FIGS. 3A and 3B, the communication system 120 further includes differential power amplifiers 106*a*, 106*b* . . . 106*n*. As will be described in detail herein, operating a power amplifier with a fully differential topology eliminates the risk of common mode oscillations through the bias feed. Thus, robust isolation is provided even when multiple transmit signal paths or chains of a single die are operating and active.

The differential power amplifiers herein can be used to amplify a wide range of frequencies, including relatively high radio frequencies of 6 GHz or more, for instance, millimeter wave frequencies in the range of about 30 GHz to about 300 GHz.

The antennas 108*a*, 108*b* . . . 108*n* can correspond to antennas implemented in a wide variety of ways. Examples of suitable antenna types include, but are not limited to, patch antennas, dipole antennas, ceramic resonators, stamped metal antennas, and/or laser direct structuring antennas. In certain implementations, the antennas 108*a*, 108*b* . . . 108*n* are arranged in an array, for instance, to provide beam forming.

The digital signal processing circuit 102 can be any suitable processing circuitry suitable for providing digital processing baseband signals and/or other signals for transmission. For instance, the digital signal processing circuit 102 can include a digital signal processor, a microprocessor, a programmable core, or any combination thereof.

In the illustrated embodiment, the digital signal processing circuit 102 includes a MIMO encoding circuit 111, a beam forming circuit 112, a digital pre-distortion (DPD) circuit 113, and a calibration circuit 114.

The MIMO encoding circuit 111 aids in providing symbol mapping to enhance the performance of MIMO communications of the communication system 120. Examples of encoding and/or pre-encoding that can be provided by the MIMO encoding circuit 111 include, but are not limited to, spatial multiplexing coding, space-time coding, and/or spatial modulation.

With continuing reference to FIGS. 3A and 3B, the beam forming circuit 112 operates to generate the I and Q signals to provide beam forming. For example, beam forming can be used to focus signal strength to overcome path losses, such as high loss associated with communicating over high signal frequencies. In certain embodiments, the communication system 120 operates using beam forming on millimeter wave frequency bands in the range of 30 GHz to 300 GHz and/or upper centimeter wave frequencies in the range of 6 GHz to 30 GHz, or more particularly, 24 GHz to 30 GHz.

The DPD circuit 113 provides digital pre-distortion to digitally shape the signals generated by the digital signal processing circuit 102. DPD can be used to reduce a distortion of and/or increase the efficiency of the differential power amplifiers 106*a*, 106*b* . . . 106*n*. Although not illustrated in FIG. 3A or 3B, the communication system 120 can include circuitry for sensing an output power of one or more of the differential power amplifiers 106*a*, 106*b* . . . 106*n*. For example, directional couplers can be included at the output of the differential power amplifiers 106*a*, 106*b* . . . 106*n* to aid in providing power detection for DPD, power control, and/or other purposes.

The calibration circuit 114 can provide a wide range of calibration techniques to compensate for impairments of the communication system 120. Examples of impairments that can be compensated for using the calibration circuit 114 include, but are not limited to phase noise, frequency error, signal compression, I/Q imbalance (for instance, gain and/or phase mismatch), local oscillator leakage, signal non-linearity, and/or spurious components.

Figure 4A:
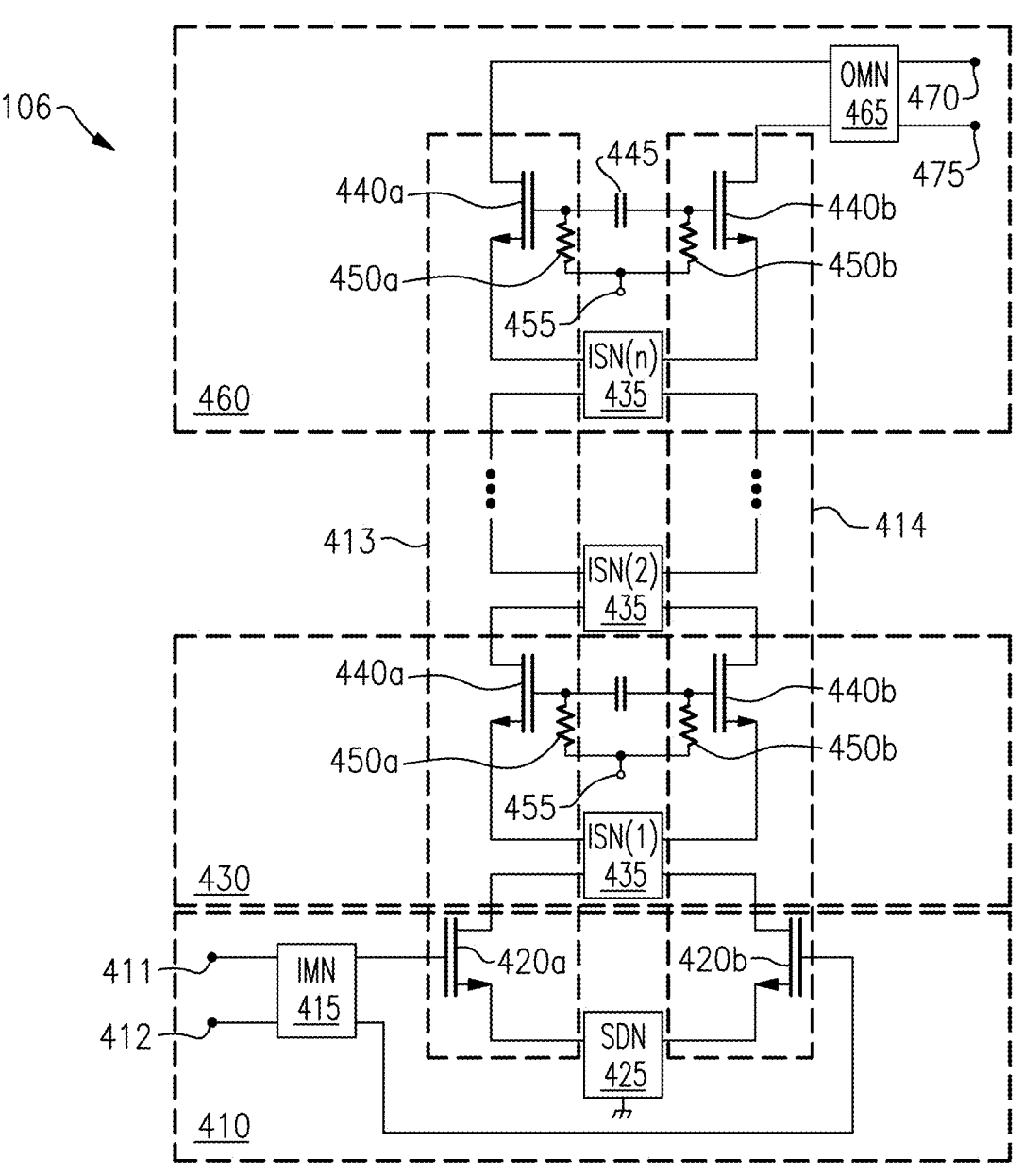
FIG. 4A is a schematic diagram of one stage of a differential power amplifier having a cascading stack transistor topology.

FIG. 4A is a schematic diagram of one embodiment of an exemplary stage of a differential power amplifier 106. One stage of the power amplifier circuit 106 comprises an input stack section 410, n intermediate stack sections including a pair of stack transistors 430, and an output stack section 460. The number of intermediate stack sections n can range from 1 to an arbitrary number of additional stack sections 430.

The input stack section 410 of the power amplifier 106 includes a pair of differential signal inputs 411/412 for connecting to other components of the communication system 120. Differential signal inputs 411/412 are configured to receive a first or non-inverted signal component and a second or inverted signal component, preferably from the I/Q modulator 104. In some embodiments, the differential power amplifier further includes an input balun configured to provide single-ended to differential signal conversion or an output balun configured to provide differential to single-ended signal conversion of the first and second signal components.

In the illustrated embodiment, the first signal component is processed using a first half circuit 413 of the differential power amplifier 106, and the second signal component is processed using a second half circuit 414 of the differential power amplifier 106. In the illustrated embodiment, the first half circuit 413 of the differential power amplifier 106 includes a first gain field-effect transistor (FET) 420a, a first group of cascode FETs 440a, and a first group of gate bias resistors 450a. Additionally, the second half circuit 414 of the differential power amplifier 106 includes a second gain FET 420b, a second group of cascode FETs 440b, and a second group of gate bias resistors 450b. As shown, the cascode FETs 440a of the first half circuit 413 are connected to corresponding cascode FETs 440b of the second half circuit 414 via differentially connected gate capacitors 445.

Figures 4B, 4C:
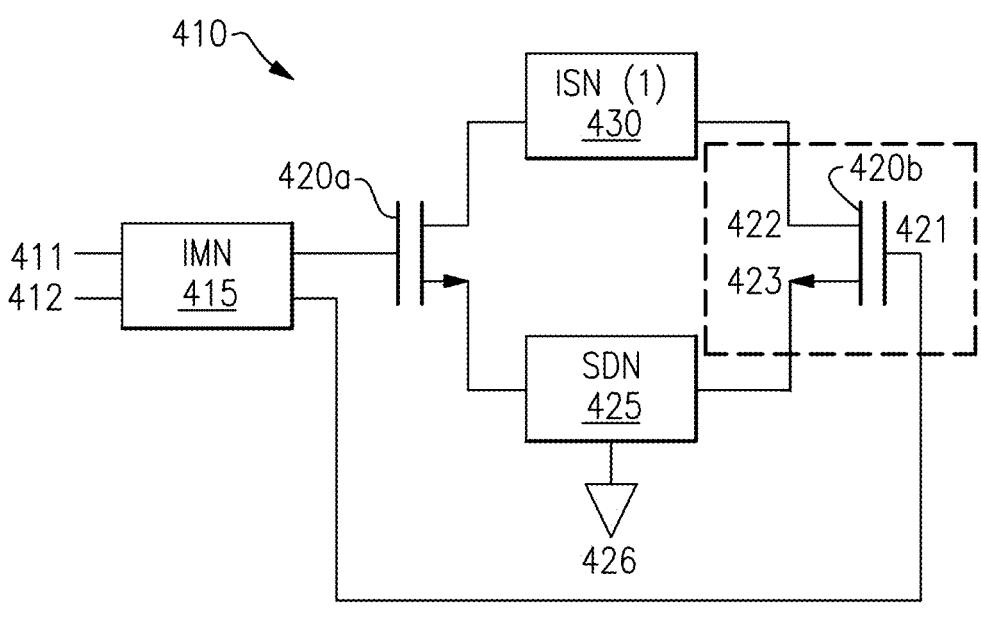
FIG. 4B is a schematic diagram of an input stack section of a differential power amplifier.
FIG. 4C is a schematic diagram of an exemplary intermediate transistor stack of a differential power amplifier.

Referring now to FIG. 4B, a schematic diagram of the input stack section 410 is shown. In addition to the differential signal inputs 411 and 412, the input stack section 410 comprises an input matching network (IMN) 415 configured to provide impedance matching, filtering, and/or conversion of the input signals prior to amplification. The input stack section 410 also includes a pair of first gain field-effect transistors 420a/420b, each of the transistors having a gate terminal 421, a drain terminal 422, and a source terminal 423. The gate terminal 421 of each of the transistors 420 is connected to one of the differential signal inputs, 411 or 412, by way of the IMN 415. The transistors 420a/420b are configured for common-source operation on symmetrical opposite sides of the first and second half circuits 413/414 to provide amplification of the inverting and non-inverting input signal components. The source terminal 423 of each of the transistors 420 is grounded by way of a source degeneration network 425, which can include a degeneration inductor, resistor, capacitor, or a combination of passive components to improve linearity of the amplifier and negate harmful feedback. The drain terminal 422 of each of the transistors sends an amplified signal component to a differential input of an inter stack network (ISN) 435. As will be described in detail herein, the ISNs 435 provide impedance matching and signal conditioning between the various stack sections of the power amplifier 106.

FIG. 4C illustrates an exemplary intermediate stack section 430, of which one or more (n total) are present in embodiments of the differential amplifier 106. The intermediate stack section 430 includes a pair of cascode FETs 440a/440b positioned on symmetrical opposite sides of the first and second half circuits 413/414. The cascode FETs 440a/440b are configured to provide increasing amplification of the differential input signal components as the signal components pass through multiple intermediate stack sections 430. Each one of the cascode FETs 440a/440b has a gate terminal 421, a drain terminal 422, and a source terminal 423. The source terminal 423 of each of the FETs 440a/440b connects to a differential output of an ISN 435 to receive impedance-matched signal components from a previous intermediate stack section 430 or from the input stack section 410. The gate terminal 421 of each of the FETs 440a/440b connects to a source of a bias voltage 455 by way of a gate bias resistor 450a/450b. The bias voltage source 455 provides voltage biasing to the gate terminals 421 of the intermediate stack sections 430. As will be described herein, in various embodiments, the bias voltage ($V_{bias}$) of each intermediate stack section is generated using a resistor divider network.

The gate terminal 421 of each of the FETs 440a/440b is also connected to a corresponding gate terminal in the opposite side half circuit of the intermediate stack section 430. The gate terminals 421 are operatively connected by a gate decoupling capacitor 445, which acts as an open circuit between the terminals 421 when the power amplifier 106 is in the common mode of operation. The common mode open can improve common mode stability of the amplifier by reducing the common mode gain, reducing or eliminating common mode oscillations caused by a feedback loop through the bias feed. The gate decoupling capacitor 445 can decouple the gate terminals 421 when the power amplifier 106 is in the differential mode of operation, leaving the differential mode gain unaffected or not significantly affected by the presence of the gate capacitor. The common mode gain is preferably less than 0 dB and the differential mode gain of the power amplifier 106 is 10 dB or greater for the combined stack sections. The gate decoupling capacitor 445 can in some cases substantially fully eliminate common mode oscillations without significantly compromising amplifier performance in the differential mode, including without significantly reducing gain, saturated output power, and/or efficiency, and/or without requiring a large surface area to mount bulky circuit components. Various embodiments of the differential power amplifier 106 may be constructed on a semiconductor die, PCB, or implemented by any other technology known to one skilled in the art. According to some embodiments, inclusion of the gate decoupling capacitor(s) 445 allows for the power amplifier circuit 106 to not include a traditional source degeneration inductor or matching transformer, which can greatly reduce the size of the amplifier circuit 106, e.g., such that the power amplifier circuit 106 is implemented on a semiconductor die.

Figure 4D:
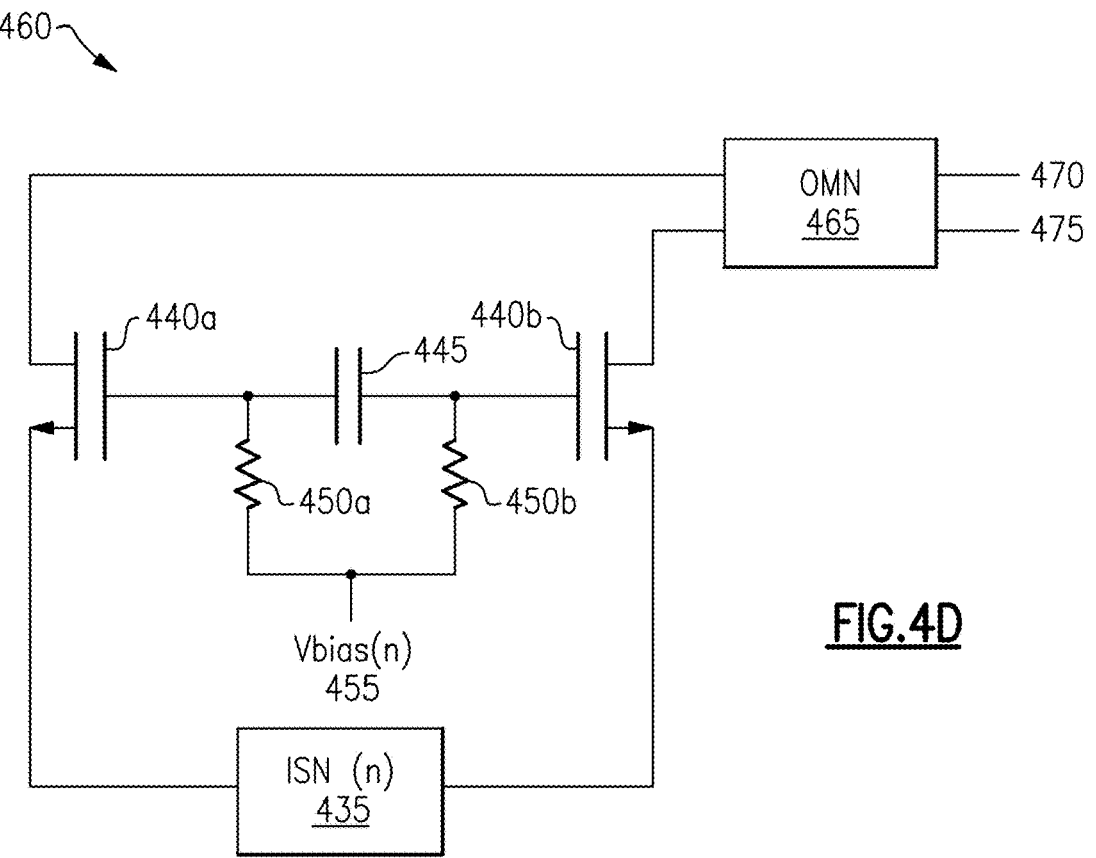
FIG. 4D is a schematic diagram of an output stack section of a differential power amplifier.

Referring now to FIG. 4D, an output stack section 460 of the power amplifier 106 is shown. The output stack section 460 includes a final pair of cascode FETs 440a/440b which receive amplified signal components from the ISN 435 of the previous intermediate stack section. The cascode FETs 440a/440b receive a bias voltage 455 and are connected across the gate terminals by way of a gate decoupling capacitor 445. Each of the drain terminals of the cascode FETs 440a/440b is connected to a differential signal output 470 or 475 by way of an output matching network (OMN) 465, which provides signal conditioning to the amplified signal components exiting the amplifier 106. In some embodiments, the OMN 465 includes an output inductor connected differentially across the first and second half circuits. In various embodiments, the output inductor includes a center tap that receives a supply voltage for supplying power to the differential power amplifier 106. In certain embodiments, the OMN 465 includes a pair of output matching capacitors, each output matching capacitor connected to a differential signal output 470 or 475 and a drain terminal 422 of a cascode FET 440a/440b.

Figure 4E:
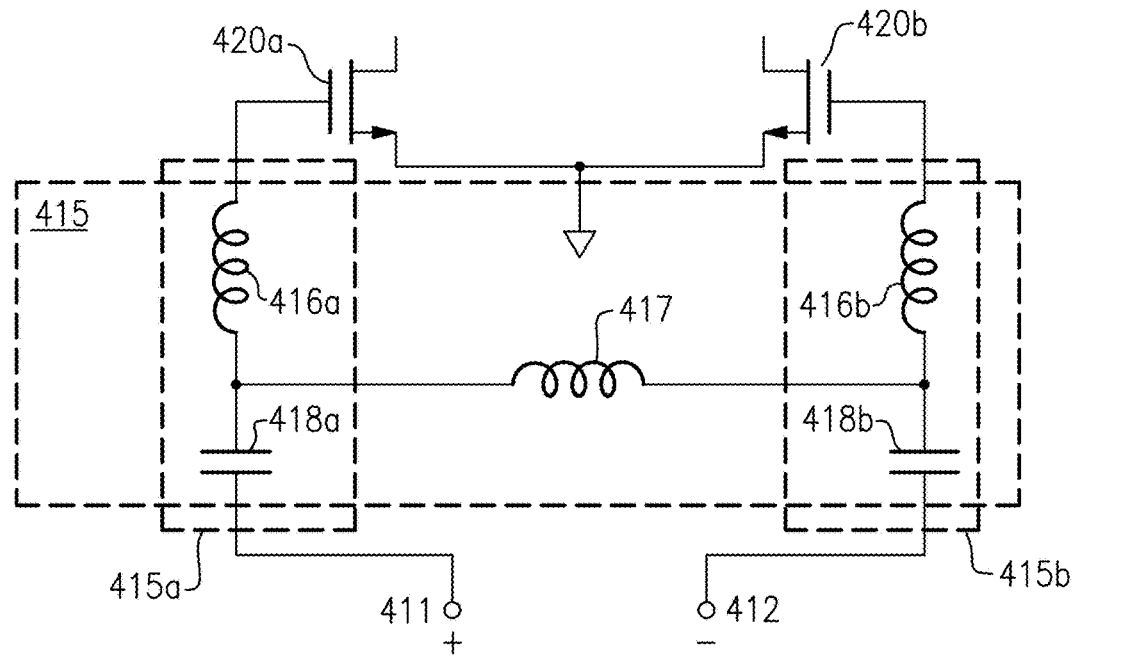
FIG. 4E is a schematic diagram of one embodiment of an input matching network (IMN) for use in a differential power amplifier.

FIG. 4E is a schematic diagram of one embodiment of an input matching network (IMN) 415 for use in a differential power amplifier 106. The IMN 415 can provide impedance matching, filtering, and signal conditioning to attenuate undesirable input signal components before the signals undergo amplification. In the illustrated embodiment, the IMN 415 includes a first IMN half circuit 415*a* comprising a first input capacitor 418*a* and a first input inductor 416*a*. Additionally, the IMN 415 includes a second IMN half circuit 415*b* comprising a second input capacitor 418*b* and a second input inductor 416*b*. The IMN 415 further includes an input inductor 417 that is connected differentially across the first and second IMN half circuits 415*a/b* between the input capacitors 418*a/b* and the input inductors 416*a/b*.

Figure 5A:
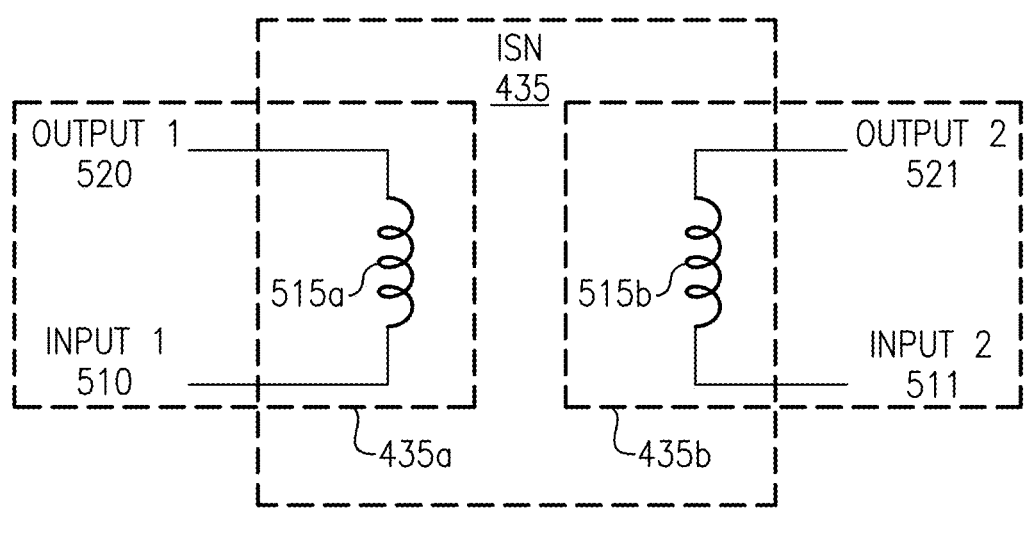
FIG. 5A is a schematic diagram of one embodiment of an inter stack network.

Referring now to FIG. 5A, one embodiment of an inter stack network (ISN) 435 is shown. A first ISN half circuit 435*a* comprises a first input terminal 510, a first output terminal 520, and a first circuit component 515*a* (such as, an inductor) electrically connected across the first input and output terminals 510/520. A second ISN half circuit 435*b* comprises a second input terminal 511, a second output terminal 521, and a second circuit component 515*b* electrically connected across the second input and output terminals 511/521. In this embodiment, the passing signal components of the first ISN half circuit 435*a* remain isolated from the signal components of the second half ISN half circuit 435*b*.

Figure 5B:
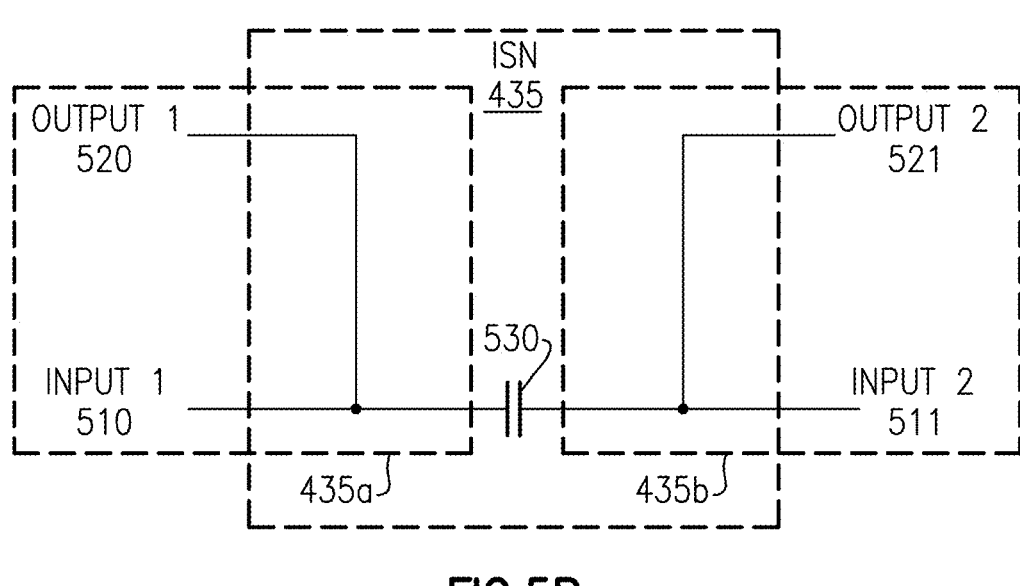
FIG. 5B is a schematic diagram of a second embodiment of an inter stack network.
Figure 5C:
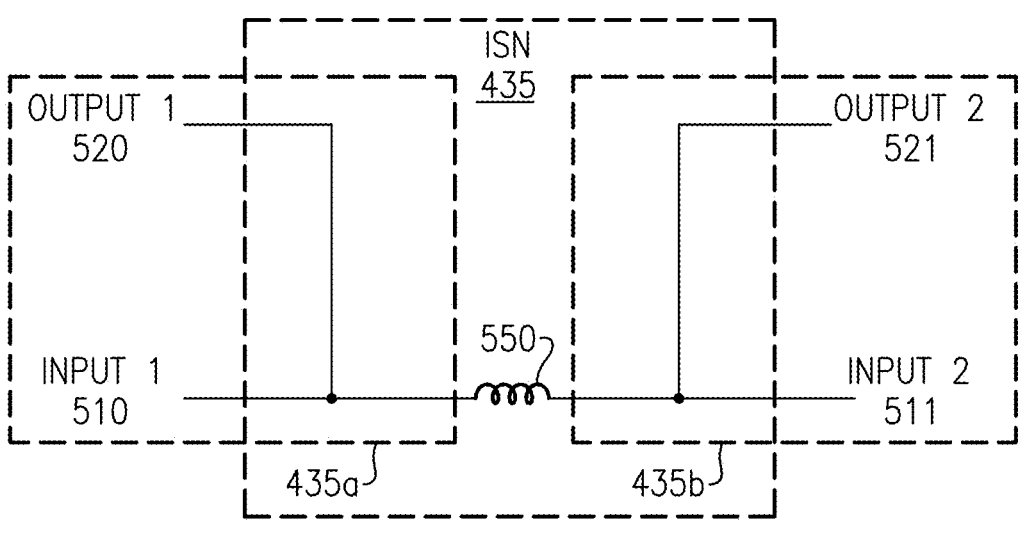
FIG. 5C is a schematic diagram of a third embodiment of an inter stack network.
Figure 5D:
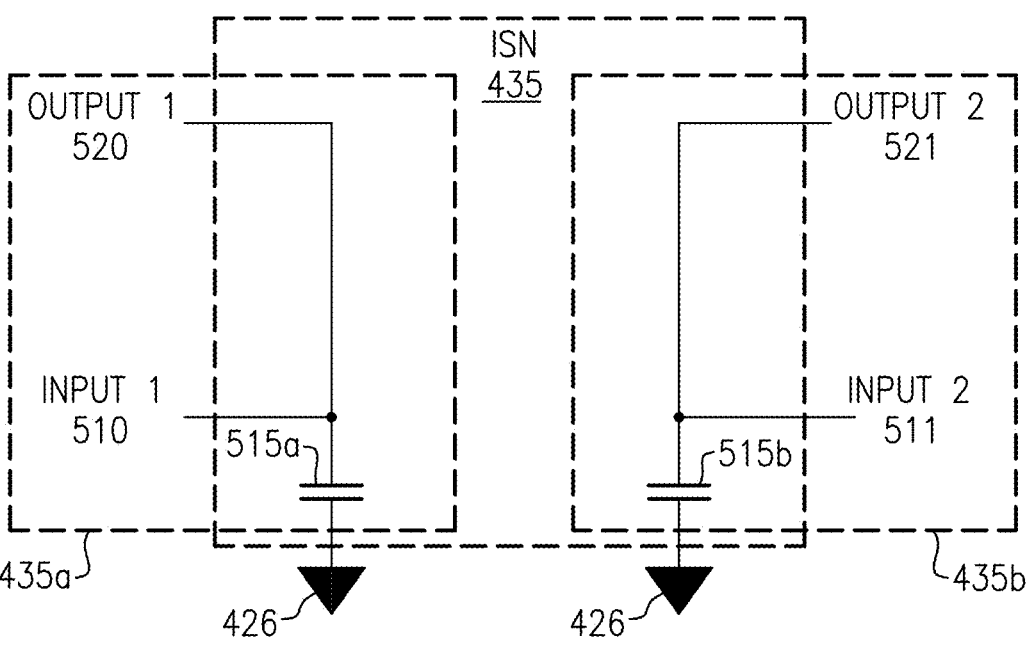
FIG. 5D is a schematic diagram of a fourth embodiment of an inter stack network.
Figure 5E:
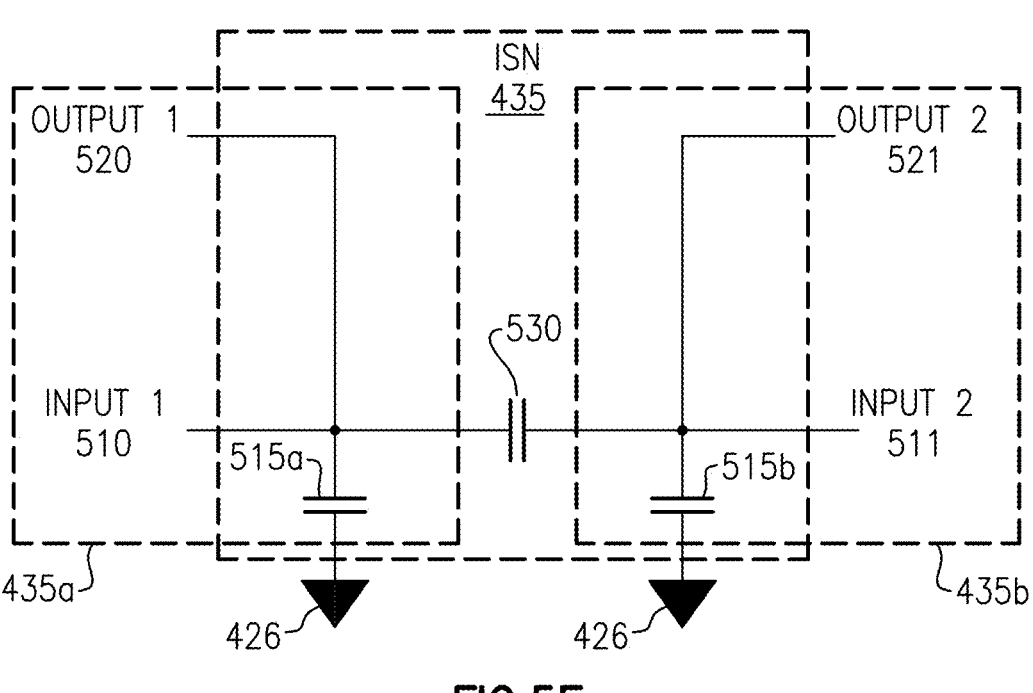
FIG. 5E is a schematic diagram of a fifth embodiment of an inter stack network.
Figure 5F:
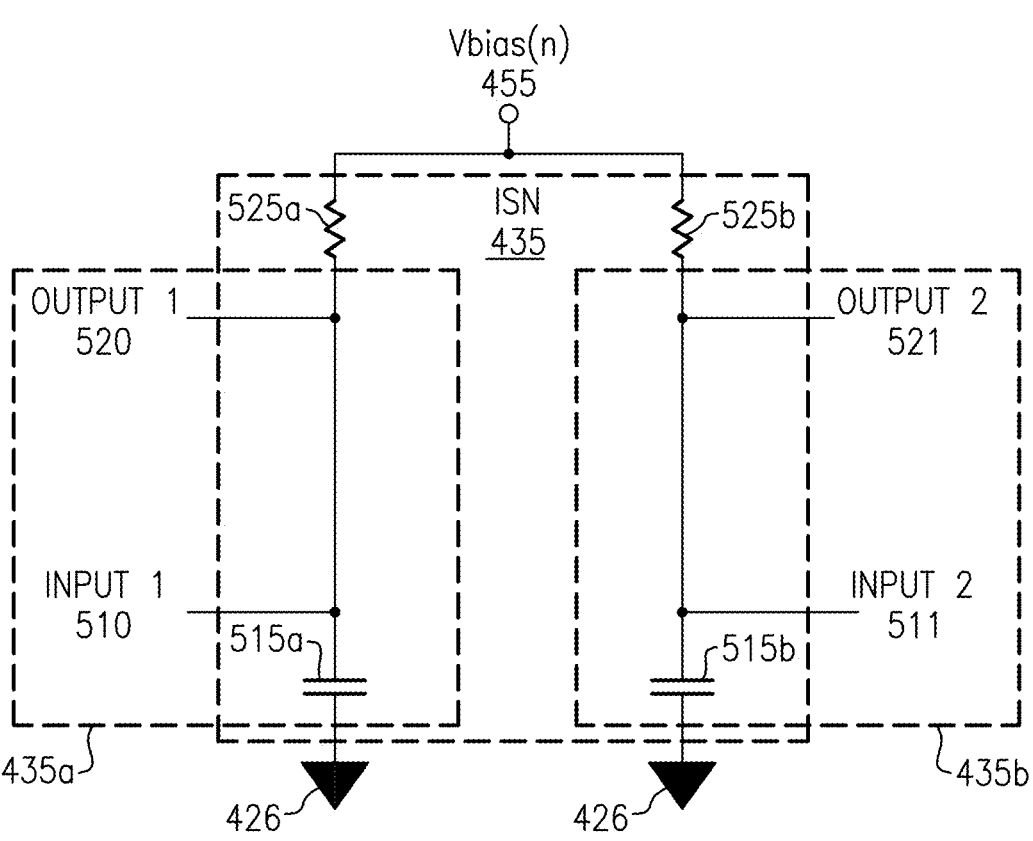
FIG. 5F is a schematic diagram of a sixth embodiment of an inter stack network.
Figure 5G:
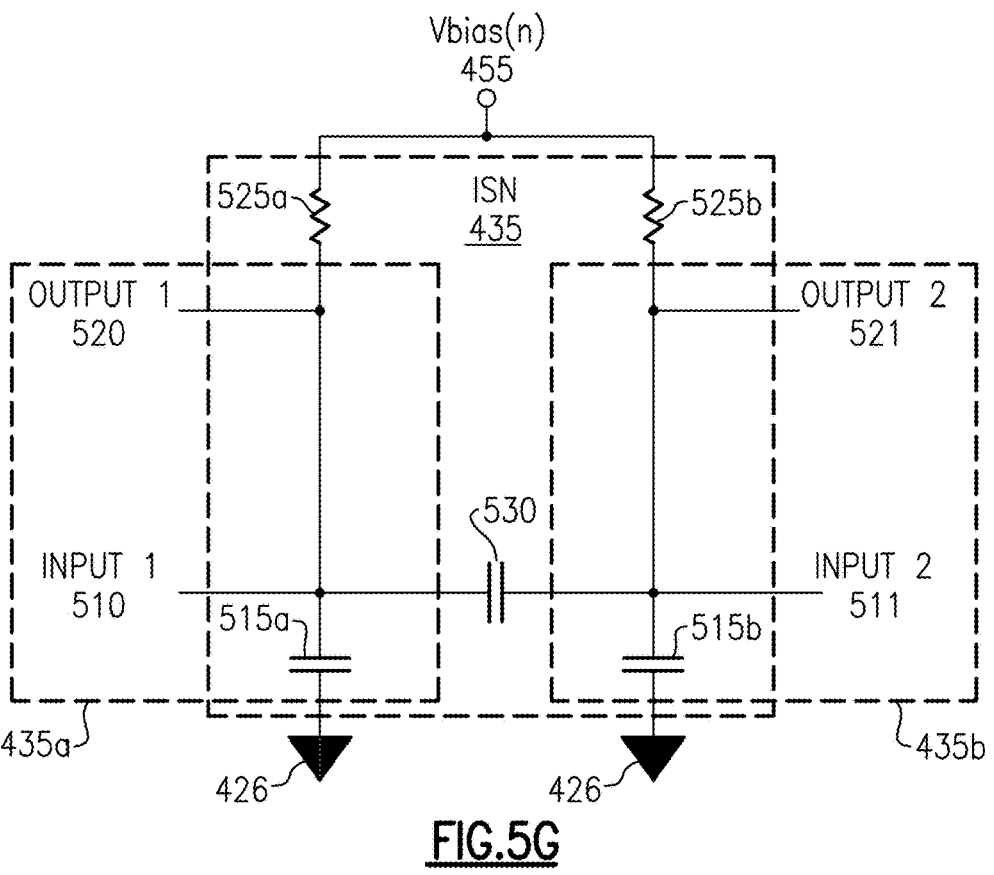
FIG. 5G is a schematic diagram of a seventh embodiment of an inter stack network.
Figure 5H:
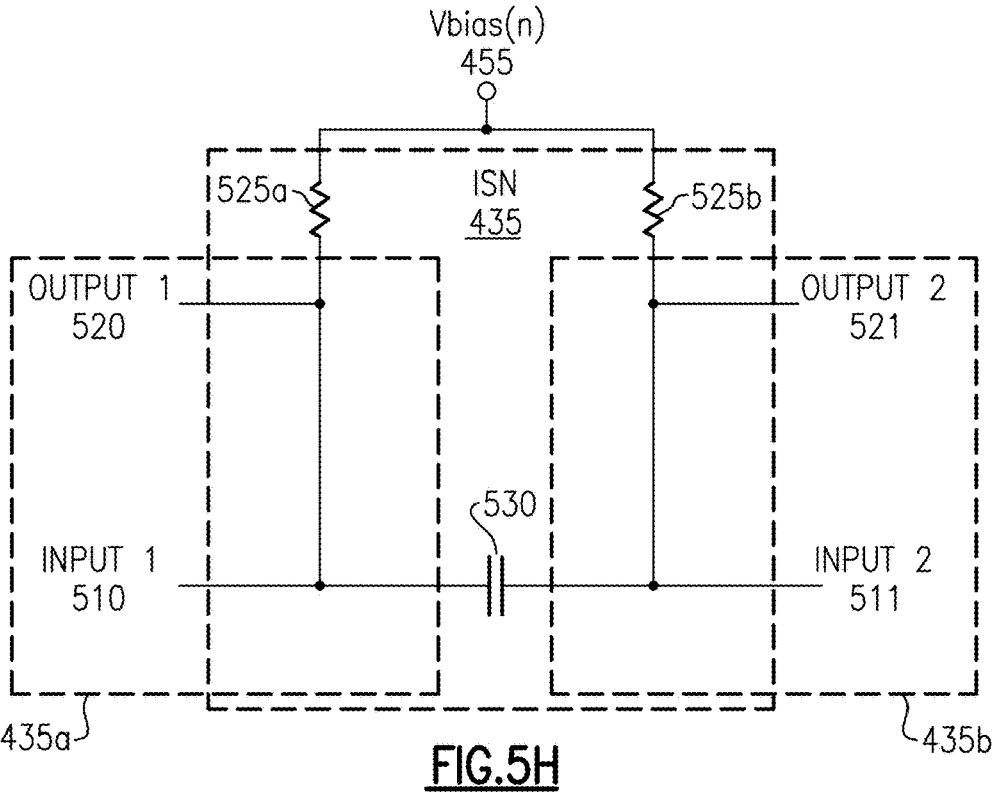
FIG. 5H is a schematic diagram of an eighth embodiment of an inter stack network.

Another embodiment of the ISN 435 is shown in FIG. 5B. The first ISN half circuit 435*a* comprises the first input terminal 510 and the first output terminal 520. The second ISN half circuit 435*b* comprises the second input terminal 511 and the second output terminal 521. A capacitor 530 electrically connects the first and second half circuits 435*a/* 435*b*. An additional embodiment of the ISN 435 is shown in FIG. 5C. The first ISN half circuit 435*a* comprises the first input terminal 510 and the first output terminal 520. The second ISN half circuit 435*b* comprises the second input terminal 511 and the second output terminal 521. An inductor 550 electrically connects the first and second half circuits 435*a/*435*b*. For the embodiments shown in FIG. 5B and FIG. 5C, inclusion of the capacitor 530 or inductor 550 provides additional signal conditioning and can improve the performance of the intermediate stack sections 430 as well as the power amplifier 106 as a whole.

FIGS. 5D-5H illustrate various additional embodiments of the ISN 435. The ISN 435 can include a pair of first and second circuit components 515*a/*515*b* (such as, capacitors) connected to ground. Voltage biasing can be applied to the ISN 435 by a pair of first and second biasing resistors 525*a/*525*b*. An ISN 435 constructed according to the present invention can include any of the features or any combination of features illustrated in the FIGS. 5A-5H.

Locating the ISN 435 between intermediate stack sections 430 distributes the RF voltage of the amplified signal components equally between the first and second half transistors 440*a/b*, which improves long-term reliability, output power, and efficiency of the power amplifier 106.

Figure 6:
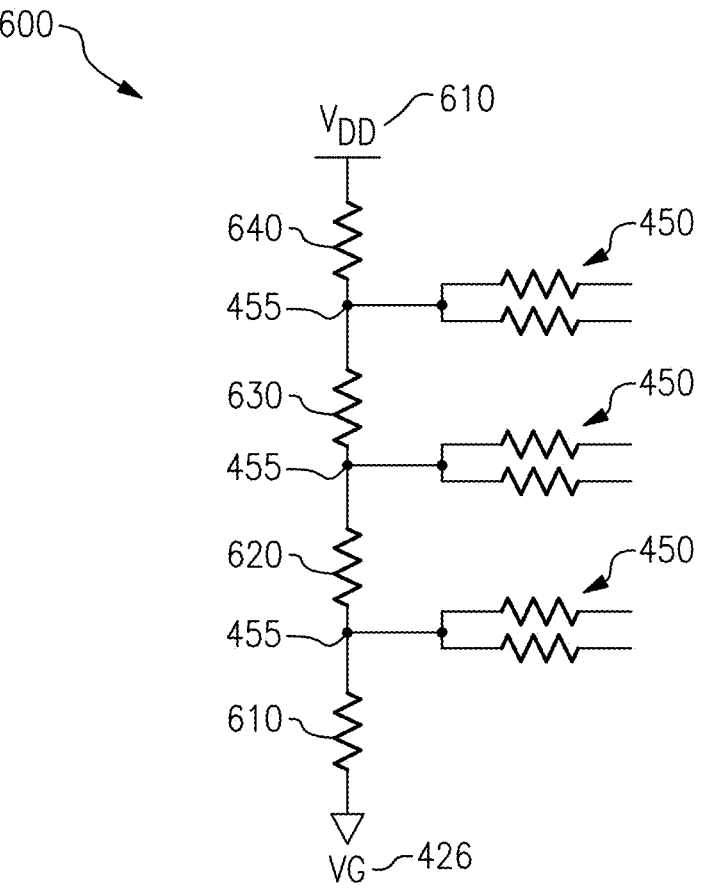
FIG. 6 is a schematic diagram of one example of a resistor divider network used to supply bias voltages to a differential power amplifier.

Referring now to FIG. 6, one embodiment of bias circuitry including a voltage divider network 600 for providing biasing is shown. In the preferred embodiment, each one of the intermediate stack sections 430 operates at a different bias voltage $V_{bias}$, the bias voltages derived from a supply voltage ($V_{DD}$) 610 using a voltage divider network 600 comprising a plurality of resistors 610-640. In the illustrated embodiment, the voltage divider network 600 generates three different bias voltages at three intermediate nodes 455, though more or fewer resistors may be present in the network to generate as many bias voltages as are required. The intermediate nodes 455 each connect to a pair of cascode FET gate terminals 421 by way of bias resistors 450 to supply the bias voltage $V_{bias}$.

Figure 7:
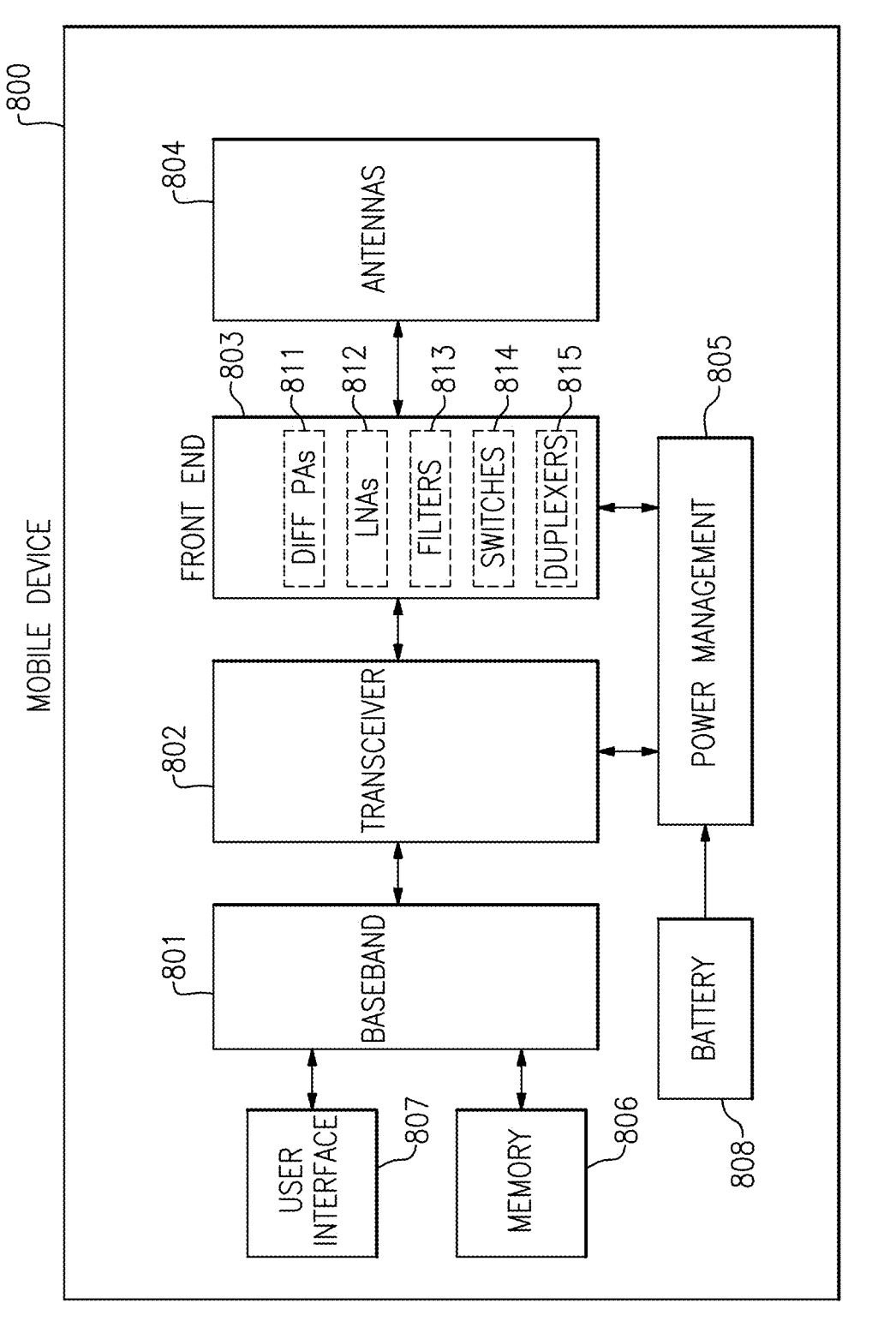
FIG. 7 is a schematic diagram of one embodiment of a mobile device.

FIG. 7 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 7 as the transceiver 802. In one example, separate components (for instance, separate circuits or dies) can be provided for handling certain types of RF signals. In certain implementations, the transceiver 802 includes the digital signal processing circuit 102 and/or one or more of the I/Q modulators 104*a*, 104*b* . . . 104*n* of FIG. 3.

The front-end system 803 aids in conditioning signals transmitted to and/or received from the antennas 804. In the illustrated embodiment, the front-end system 803 includes one or more differential power amplifiers (PAs) 811, one or more low noise amplifiers (LNAs) 812, one or more filters 813, one or more switches 814, and one or more duplexers 815. Although various example components of the front-end system 803 are shown in FIG. 7, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

Although FIG. 7 illustrates one example of an RF communication system that can include differential power amplifiers implemented in accordance with the teachings herein, differential power amplifiers can be used in other configurations of electronics.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beam forming in certain implementations. For example, the front-end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beam forming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 7, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the PA supply control circuit can be implemented to provide average power tracking (APT), envelope tracking (ET), and/or any other suitable supply control scheme. In other implementations, the supply voltage corresponds to a battery voltage, a fixed voltage, or other suitable supply voltage.

In one embodiment, the power management system 805 includes an envelope tracker for controlling a power amplifier supply voltage of at least one differential power amplifier of the differential power amplifiers 811 based on an envelope of an RF signal amplified by the differential power amplifier.

As shown in FIG. 7, the power management system 805 receives a battery voltage from the battery 808. The battery 808 can be any suitable battery for use in the mobile device 800, including, for example, a lithium-ion battery.

Figure 8A:
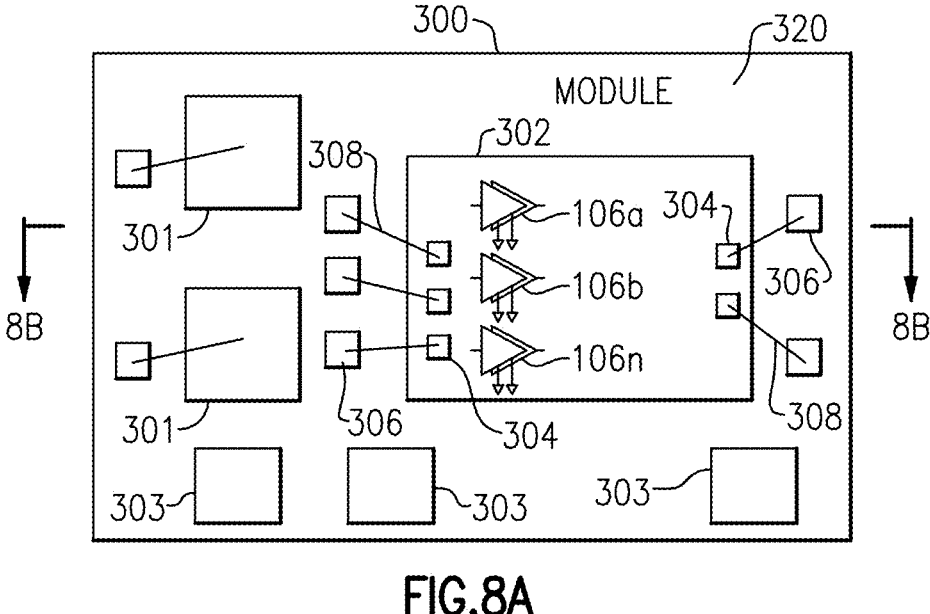
FIG. 8A is a schematic diagram of one embodiment of a packaged module.
Figure 8B:
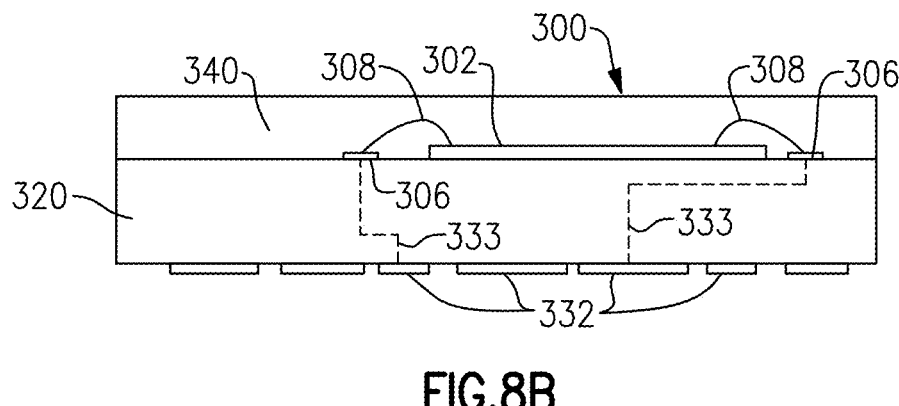
FIG. 8B is a schematic diagram of a cross-section of the packaged module of FIG. 8A taken along the lines 8B-8B.

FIG. 8A is a schematic diagram of one embodiment of a packaged module 300. FIG. 8B is a schematic diagram of a cross-section of the packaged module 300 of FIG. 8A taken along the lines 8B-8B.

The packaged module 300 includes semiconductor dies 301, a semiconductor power amplifier die 302, surface mount components 303, wirebonds 308, a package substrate 320, and encapsulation structure 340. The package substrate 320 includes pads 306 formed from conductors disposed therein. Additionally, the semiconductor power amplifier die 302 includes pins or pads 304, and the wirebonds 308 have been used to connect the pads 304 of the power amplifier die 302 to the pads 306 of the package substrate 301. A portion of the pads 304 correspond to ground pads that are configured to receive a ground voltage.

The semiconductor power amplifier die 302 includes a differential power amplifiers 106a, 106b . . . 106n, which can be implemented in accordance with one or more features disclosed herein. Although the illustrated semiconductor power amplifier die 302 includes three differential power amplifiers, more or fewer power amplifiers can be included on the power amplifier die 302 as indicated by the ellipses. The semiconductor power amplifier die 302 further includes at least one differential ground network for distributing ground from the ground pads to the differential power amplifiers 106a, 106b . . . 106n.

The packaging substrate 320 can be configured to receive a plurality of components such as the semiconductor dies 301, the semiconductor power amplifier die 302 and the surface mount components 303, which can include, for example, surface mount capacitors and/or inductors.

In certain embodiments, at least one of the semiconductor dies 301 includes a transceiver (for instance, the transceiver 802 of FIG. 7), a baseband processor (for instance, the baseband processor 801 of FIG. 7), a power management circuit (for instance, the power management circuit 805 of FIG. 7), front-end circuitry (for instance, one or more components of the front-end circuit 803 of FIG. 7), a digital signal processing circuit (for instance, the digital signal processing circuit 102 of FIG. 3), and/or an I/Q modulator (for instance, the I/Q modulators 104a, 104b . . . 104n of FIG. 3). Although FIG. 8A illustrates two dies 301, more or fewer of the dies 301 can be included. Moreover, each of the dies 301 can include different circuit fabricated thereon and/or can be manufactured using different processing technologies.

As shown in FIG. 8B, the packaged module 300 is shown to include a plurality of contact pads 332 disposed on the side of the packaged module 300 opposite the side used to mount the semiconductor power amplifier die 302. Configuring the packaged module 300 in this manner can aid in connecting the packaged module 300 to a circuit board, such as a phone board of a wireless device. The example contact pads 332 can be configured to provide radio frequency signals, bias signals, and/or power (for example, a power supply voltage and ground) to the semiconductor power amplifier die 302 and/or the surface mount components 303. As shown in FIG. 8B, the electrical connections between the contact pads 332 and the semiconductor power amplifier die 302 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip chip configurations.

Figures 9A, 9B:
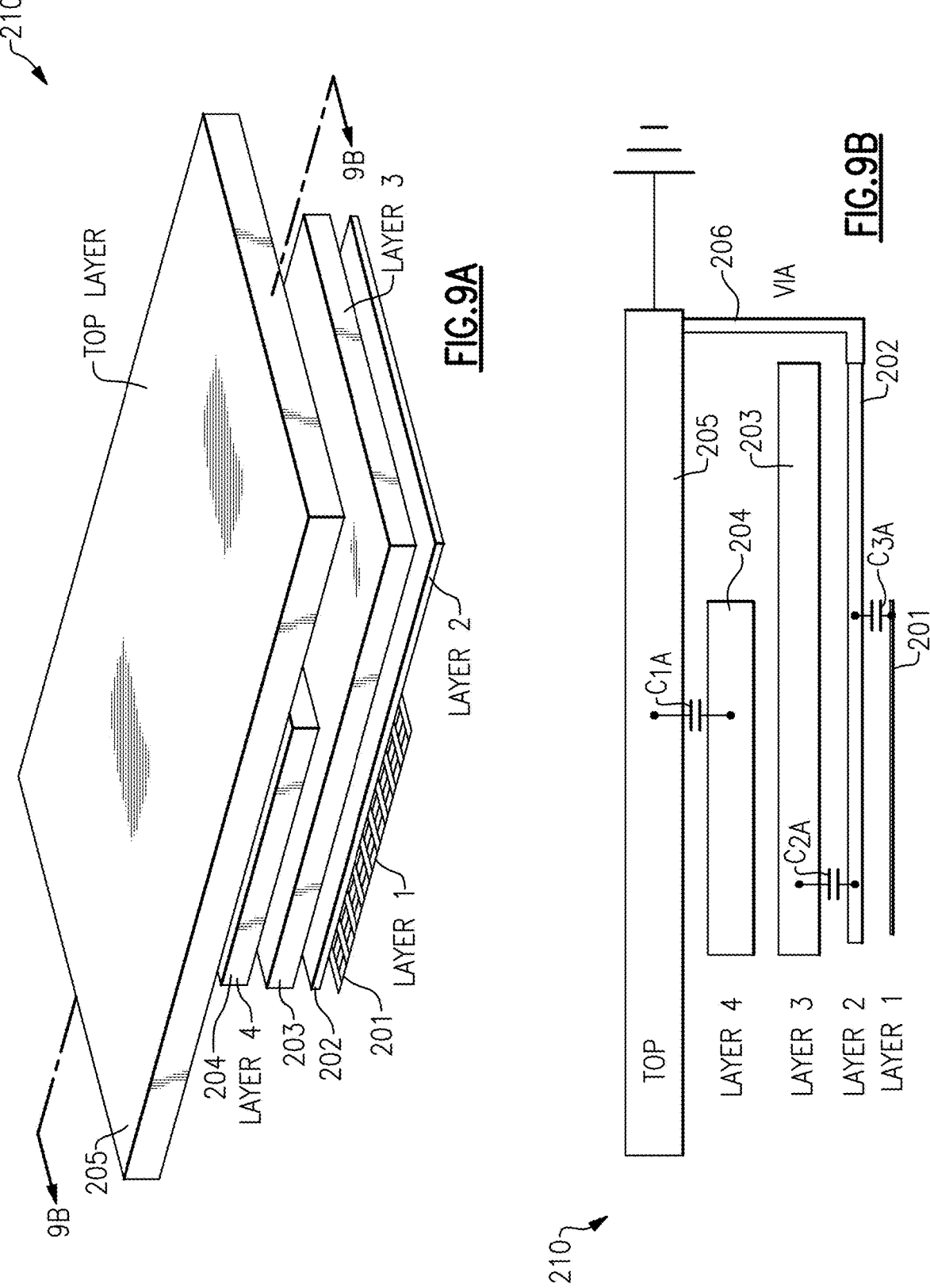
FIG. 9A is a schematic perspective view of one embodiment of intermetal capacitors for a differential power amplifier.
FIG. 9B is an annotated cross section of the intermetal capacitors of FIG. 9A taken along the lines 9B-9B.

FIG. 9A is a schematic perspective view of one embodiment of intermetal capacitors 210 for a differential power amplifier. FIG. 9B is an annotated cross section of the intermetal capacitors 210 of FIG. 9A taken along the lines 9B-9B.

The intermetal capacitors 210 includes a stack of metal conductors including a first metal conductor 201, a second metal conductor 202, a third metal conductor 203, a fourth metal conductor 204, and a fifth metal conductor 205. The metal conductors 201-205 are formed on different conductive layers of a semiconductor die on which the differential power amplifier is fabricated. For clarity of the figures, devices and other components of the differential power amplifier are not depicted in FIGS. 9A-9B. As shown in FIG. 9B, a via 206 connects the second metal conductor 202 to the fifth metal conductor 205, which in turn is connected to a ground distribution conductor of a differential ground network. For clarity of the figures, the via 206 is omitted from the perspective view of FIG. 9A.

FIG. 9B has been annotated to show certain capacitors present in the conductor stack. For example, a capacitor C1A is formed between the fourth metal conductor 204 and the fifth metal conductor 205. Additionally, a capacitor C2A is formed between the second metal conductor 202 and the third metal conductor 203. Furthermore, a capacitor C3A is formed between the first conductor 201 and the second conductor 202.

In certain implementations, a differential power amplifier includes FETs, and the intermetal capacitors 210 are used to implement gate decoupling capacitors 445. Although various examples in which the intermetal capacitors 210 implement gate capacitors have been described, other configurations are possible, such as implementations in which a differential power amplifier includes bipolar transistors and the intermetal capacitors 210 serve as base capacitors.

The intermetal capacitors 210 include stacked capacitor structures, and thus high density can be achieved. Furthermore, presence of a ground layer aids in providing very good isolation at high frequencies.

Although the intermetal capacitors 210 illustrate one embodiment of capacitors suitable for use in a differential power amplifier, the differential power amplifiers herein can include other implementations of capacitors.

What is claimed is:

1. A power amplifier system having differential power amplifiers each including a first half circuit and a second half circuit that operate differentially to provide amplification of radio frequency signals, the power amplifier system comprising:

first and second differential power amplifiers each including at least a first and second stack section each including a first-half field effect transistor and a second-half field effect transistor, a gate decoupling capacitor differentially connecting gate terminals of the first-half field effect transistor and the second-half field effect transistor together to attenuate signals in common mode operation, and a first-half bias resistor and a second-half bias resistor, the bias resistors connecting the gate terminals of the first-half field effect transistor and the second-half field effect transistor to a voltage source; and an inter stack network connecting an output of the first stack section to an input of the second stack section; and a digital signal processing circuit configured to control a first radio frequency input signal to the first differential power amplifier and a second radio frequency input signal to the second differential power amplifier, the digital signal processing circuit operable to provide at least one of multi-input multi-output encoding or beam forming.

2. The power amplifier system of claim 1 wherein each of the first and second differential power amplifiers further includes an input stack section having a first-half field effect transistor and a second-half field effect transistor having gate terminals connected to a pair of differential signal inputs.

3. The power amplifier system of claim 2 wherein each of the first and second differential power amplifiers further includes an input matching network connected to the differential signal inputs.

4. The power amplifier system of claim 2 wherein each of the first and second differential power amplifiers further includes a source degeneration network connected to source terminals of the input stack section.

5. The power amplifier system of claim 1 wherein each of the first and second differential power amplifiers further includes an output stack section having a first-half field effect transistor and a second-half field effect transistor having drain terminals connected to a pair of differential signal outputs.

6. The power amplifier system of claim 5 wherein each of the first and second differential power amplifiers further includes an output matching network connected to the differential signal outputs.

7. The power amplifier system of claim 1 wherein each of the first and second differential power amplifiers further includes at least one of an input balun configured to provide single-ended to differential signal conversion or an output balun configured to provide differential to single-ended signal conversion.

8. A radio frequency system including a semiconductor die, the system comprising:

a semiconductor die including a substrate and first and second differential power amplifiers supported by the substrate and each including a first half circuit and a second half circuit that operate differentially to provide amplification, and each further including a plurality of intermediate stack sections each including first-half and second-half field effect transistors, first-half and second-half bias resistors, and a gate decoupling capacitor, the gate decoupling capacitor connecting gate terminals of the first-half and second-half field effect transistors together to attenuate signals in common mode operation, the first-half bias resistor connected between the gate terminal of the first-half field effect transistor and a voltage source, the second-half bias resistor connected between the gate terminal of the second-half field effect transistor and the voltage source, the power amplifier further including a plurality of inter stack networks connected between at least some of the stack sections to provide impedance matching; and a digital signal processing circuit configured to control a first radio frequency input signal to the first differential power amplifier and a second radio frequency input signal to the second differential power amplifier, the digital signal processing circuit operable to provide at least one of multi-input multi-output encoding or beam forming.

9. The radio frequency system of claim 8 wherein each of the first and second differential power amplifiers further includes an input stack section having a first-half and a second-half field effect transistor having gate terminals connected to a pair of differential signal inputs.

10. The radio frequency system of claim 9 wherein each of the first and second differential power amplifiers further includes an input matching network connected to the differential signal inputs.

11. The radio frequency system of claim 9 wherein each of the first and second differential power amplifiers further includes a source degeneration network connected to source terminals of the input stack section transistors.

12. The radio frequency system of claim 8 wherein each of the first and second differential power amplifiers further includes an output stack section having a first-half and a second-half field effect transistor having drain terminals connected to a pair of differential signal outputs.

13. The radio frequency system of claim 12 wherein each of the first and second differential power amplifiers further includes an output matching network connected to the differential signal outputs.

14. The radio frequency system of claim 8 wherein each inter stack network includes an inductor or a capacitor network.

15. The radio frequency system of claim 14 wherein the inductor or capacitor network includes a first-half and second-half inductor each connected serially between an input terminal and an output terminal of the inter stack network.

16. The radio frequency system of claim 14 wherein the inductor or capacitor network electrically connects a first input to a second input of the inter stack network, and electrically connects a first output and a second output of the inter stack network.

17. The radio frequency system of claim 8 further comprising a voltage ladder utilizing a resistor divider to generate a plurality of voltage sources for biasing the intermediate stack sections.

18. The radio frequency system of claim 8 wherein the differential power amplifier includes a plurality of amplification stages to provide cascading signal amplification, the plurality of amplification stages including an output stack section of one amplification stage which is operably connected to an input stack section of an adjacent amplification stage.

19. A mobile device comprising:

an antenna; and a radio frequency module operatively coupled to the antenna, the module including first and second differential power amplifiers each including a first half circuit and a second half circuit that operate differentially to provide amplification, the power amplifier including a plurality of intermediate stack sections each including first-half and second-half field effect transistors, first-half and second-half bias resistors, a gate decoupling capacitor connecting gate terminals of the first-half and second-half field effect transistors together to attenuate signals in common mode operation, the first-half bias resistor connected between the gate terminal of the first-half field effect transistor and a voltage source, the second-half bias resistor connected between the gate terminal of the second-half field effect transistor and the voltage source, the power amplifier further including a plurality of inter stack networks connected between at least some of the stack sections to provide impedance matching; and a digital signal processing circuit configured to control a first radio frequency input signal to the first differential power amplifier and a second radio frequency input signal to the second differential power amplifier, the digital signal processing circuit operable to provide at least one of multi-input multi-output encoding or beam forming.

20. The mobile device of claim 19 further comprising a transceiver that includes the digital processing circuit.

* * * * *